United States Patent [19]
Ishikawa et al.

[11] Patent Number: 5,408,690
[45] Date of Patent: Apr. 18, 1995

[54] ANTENNA SUPERVISING APPARATUS COMPRISING A STANDING WAVE RATIO MEASURING UNIT

[75] Inventors: Youhei Ishikawa; Sadao Yamashita; Hidekazu Wada, all of Kyoto, Japan

[73] Assignee: Murata Mfg. Co., Ltd., Kyoto, Japan

[21] Appl. No.: 212,428

[22] Filed: Mar. 11, 1994

Related U.S. Application Data

[62] Division of Ser. No. 768,390, Sep. 30, 1991, abandoned.

[30] Foreign Application Priority Data

| Oct. 1, 1990 | [JP] | Japan | 2-264236 |
| Apr. 10, 1991 | [JP] | Japan | 3-77632 |
| Aug. 20, 1991 | [JP] | Japan | 3-207882 |

[51] Int. Cl.$^6$ .............................................. H04B 1/04
[52] U.S. Cl. ................... 455/115; 455/123; 333/17.2; 330/207 P; 324/646
[58] Field of Search ............... 330/207 P, 298; 455/115, 117, 123; 324/645, 646; 333/17.3

[56] References Cited

U.S. PATENT DOCUMENTS

| 3,970,940 | 7/1976 | Venn . | |
| 4,165,493 | 8/1979 | Harrington . | |
| 4,249,257 | 2/1981 | Campbell | 455/115 |
| 4,267,600 | 5/1981 | Campbell . | |
| 4,729,129 | 3/1988 | Koerner | 330/207 P |
| 4,758,775 | 7/1988 | Roos . | |
| 5,113,525 | 5/1992 | Andoh . | |

FOREIGN PATENT DOCUMENTS

| 1281564 | 10/1958 | Germany . |
| 3317358 | 11/1983 | Germany . |
| 55-3569 | 1/1980 | Japan . |
| 55-88171 | 6/1980 | Japan . |
| 8808211 | 10/1988 | WIPO . |

OTHER PUBLICATIONS

English Translation of a portion of Japanese Utility Model Laid-Open Publication Jan. 1980 No. 55-3569.
English Translation of a portion of Japanese Utility Model Laid-Open Publication Jun. 1980 No. 55-88171.
Patent Abstracts of Japan; vol. 6, No. 237 (P-157)(1115) Nov. 25, 1982; and JP-A-57 137 866 (Noda Tsuushin).
E. Grohmann, et al., "Radio Base RBS 901 for the Nordic Mobile Telephone System", Philips Telecommunication & Data Systems Review vol. 45, No. 3 pp. 69–80, Sep. 1987, Hilversum, The Netherlands.

*Primary Examiner*—Kenneth A. Wieder
*Assistant Examiner*—Jose M. Solis
*Attorney, Agent, or Firm*—Ostrolenk, Faber, Gerb & Soffen

[57] ABSTRACT

In an antenna supervising apparatus for supplying a multiplexed signal comprised of a plurality of carrier wave signals respectively outputted from a plurality of transmitters through a transmission line to an antenna, a directional coupler detects progressive signals of the multiplexed signal to the antenna and the reflected signals thereof from the antenna, and a band-pass filter respectively filters the progressive signal and the reflected signal of one carrier wave signal preselected among those of the detected multiplexed signal. Further, a detector respectively detects the filtered progressive signal and the filtered reflected signal of the one carrier wave signal, and a micro processing unit calculates a standing wave ratio with respect to the preselected one carrier wave signal based on the detected signals.

11 Claims, 21 Drawing Sheets

ANTENNA SUPERVISING APPARATUS COMPRISING A STANDING WAVE RATIO MEASURING UNIT

This is a division of application Ser. No. 07/768,390, filed Sep. 30, 1991, now abandoned.

BACKGROUND OF THE INVENTION

1. Field of the Invention

The present invention relates to an antenna supervising apparatus, and more particularly, to an antenna supervising apparatus comprising a measuring unit for measuring a standing wave ratio (referred to as an SWR hereinafter) in order to supervise an impedance matching state between transmitters and an antenna. A voltage standing wave ratio is referred to as a VSWR hereinafter.

2. Description of the Prior Art

Recently, mobile radio communication systems such as an automobile radio communication system, an airplane radio communication system have been put into practical use accompanying developments of radio communication technique. FIG. 7 shows a conventional cellular radio zone type mobile radio communication system.

As shown in FIG. 7, base stations 2 are provided within respective small radio zones 1 corresponding divided service areas, and radio communications are performed between mobile stations 3 located within a small radio zone 1 and a base station 2 of the small radio zone 1 through communication channels 4 and control channels 5 used for transmitting calling signals. The respective base stations 2 are connected through an exchange control station 6 and an exchange control subsystem 7 to a fixed telephone network 9 connected to fixed telephones 8. In such cellular radio zone type mobile radio communication system, each cell, of the radio zone 1 is further divided according to increase in a number of subscribers. Then, according to the division of the cell, it is necessary to alter the frequencies to be used in the respective base stations 2, for example, using commands transmitted from the exchange control station 6.

As shown in FIG. 8, the base station 2 comprises plural transmitters Tx1, Tx2, ..., Txi, ..., Txn (i is a natural number which is equal to or larger than one and equal to or smaller than a natural number n) for respectively transmitting carrier waves having frequencies f1 to fn different from each other. The respective outputs of the transmitters Tx1, Tx2, ..., Txi, ..., Txn are outputted, through corresponding respective isolators I1, I2, ..., Ii, ..., In constituted by three terminal type circulators each having one terminated terminal, to corresponding respective band-pass filters F1, F2, ..., Fi, Fn which are provided with the isolators I1, I2, ..., Ii, ..., In in a transmitter combiner 11, and are then band-pass-filtered. Thereafter, the outputs of the band-pass filters F1, F2, ..., Fi, ..., Fn are frequency-multiplexed, and a multiplexed wave comprised of respective carrier waves frequency-multiplexed is outputted through a directional coupler 12 for detecting a progressive wave transmitted to an antenna 13 and detecting a reflected wave transmitted from the antenna 13, and an antenna filter F0 of a band-pass filter for band-pass-filtering the multiplexed wave to the antenna 13, thereby projecting the multiplexed wave as a radio wave toward a free space.

In order to establish a certain reliability of the radio communication and to prevent occurrence of radio interferences etc., a high frequency power projected from the antenna 13 toward the free space and an impedance matching state between a transmitter system and an antenna system are always supervised in the base station 2.

As further shown in FIG. 8, in an antenna supervising apparatus 100 provided in the conventional cellular radio zone type mobile radio communication system, a progressive wave transmitted to the antenna 13 and a reflected wave transmitted from the antenna 13 are detected by the directional coupler 12 which is inserted between the antenna filter F0 and the transmitter combiner 11, and the progressive wave and the reflected wave outputted from the directional coupler 12 are respectively detected by detectors 14 and 15 of diodes so as to obtain direct-current voltages which are respectively in proportion to the progressive wave and the reflected wave. The detector outputs of the progressive wave and the reflected wave are inputted to a calculation circuit 16, and then, in response thereto, a high frequency power projected from the antenna 13 to the free space and a VSWR of the antenna system comprised of the antenna 13 and a transmission line located from the directional coupler 12 to the antenna 13 are calculated by the calculation circuit 16. Thereafter, the calculated result is displayed on a display unit 17.

However, in the conventional antenna supervising apparatus 100, since the progressive wave and the reflected wave of the multiplexed wave comprised of respective carrier waves are detected by the directional coupler 12 comprising two coupling lines and are detected by the detectors 14 and 15, beat signals of frequencies (f1-f2), (f1-f3), etc. are superimposed in the outputs of the detectors 14 and 15. Due to the beat signals, the outputs of the detectors 14 and 15 change as a time passes as shown in FIG. 10, resulting in decrease in detection precision of respective levels of the above-mentioned progressive wave and reflected wave. Therefore, there is such a problem that detection precision of the high frequency power and the VSWR calculated by the calculation circuit 16 in response to the progressive wave and the reflected wave are lowered.

Further, when an interference wave having the other frequency is inputted from an external apparatus or system to the antenna 13, the interference wave is superimposed in the reflected wave, there is such a problem that the level of the reflected wave and the VSWR can not be correctly measured.

SUMMARY OF THE INVENTION

The first object of the present invention is therefore to provide an antenna supervising apparatus capable of measuring an SWR on a transmission line of an antenna system for transmitting a frequency-multiplexed wave, with a precision higher than that of the conventional apparatus, without receiving any influence of an interference wave.

The second object of the present invention is to provide an antenna supervising apparatus capable of measuring a level of a reflected wave coming back from an antenna system for transmitting a frequency-multiplexed wave, with a precision higher than that of the conventional apparatus, without receiving any influence of an interference wave.

The third object of the present invention is to provide an antenna supervising apparatus having a simple structure, capable of easily taking measures when frequencies of carrier waves transmitted from a base station of a mobile radio communication system are altered, and also capable of easily taking measures for an uninhabited base station.

The fourth object of the present invention is to provide an SWR measuring apparatus capable of measuring a VSWR of a particular high frequency signal transmitted on a transmission line, with a precision higher than that of the conventional apparatus, without receiving any influence of an interference wave and independent of a phase of a reflected wave.

The fifth object of the present invention is to provide a reflected wave measuring apparatus capable of measuring a level of a reflected wave of a particular high frequency signal transmitted on a transmission line, with a precision higher than that of the conventional apparatus, without receiving any influence of an interference wave and independent of a phase of the reflected wave.

In order to achieve the aforementioned objective, according to one aspect of the present invention, there is provided an antenna supervising apparatus for supplying a multiplexed signal comprised of a plurality of carrier wave signals respectively outputted from a plurality of transmitters to an antenna and measuring a standing wave ratio on a transmission line of a radio transmission system for transmitting said multiplexed signal from said antenna to a free space based on a progressive signal transmitted from one of said transmitters through said transmission line to said antenna and a reflected signal transmitted from said antenna through said transmission line, comprising:

coupling means provided on said transmission line for detecting said progressive signals and said reflected signals of said multiplexed signal;

band-pass-filtering means for respectively band-pass-filtering said progressive signal and said reflected signal of one carrier wave signal preselected among said progressive signals and said reflected signals of said multiplexed signal detected by said coupling means with a predetermined pass band and outputting said filtered progressive signal and said filtered reflected signal of said preselected one carrier wave signal;

detecting means for respectively detecting said filtered progressive signal and said filtered reflected signal of said one carrier wave signal outputted from said filtering means and outputting said respective detected signals; and calculating means for calculating a standing wave ratio with respect to said preselected one carrier wave signal based on said respective detected signals outputted from said detecting means.

According to another aspect of the present invention, there is provided an antenna supervising apparatus for supplying a multiplexed signal comprised of a plurality of carrier wave signals respectively outputted from a plurality of transmitters to an antenna and measuring a standing wave ratio on a transmission line of a radio transmission system for transmitting said multiplexed signal from said antenna to a free space based on a progressive signal transmitted from one of said transmitters through said transmission line to said antenna and a reflected signal transmitted from said antenna through said transmission line, comprising:

coupling means provided on said transmission line for detecting said progressive signals and said reflected signals of said multiplexed signal;

first frequency converting means for converting said progressive signals of said multiplexed signal detected by said coupling means into a first intermediate frequency signal relating to said progressive signal of one carrier wave signal preselected among said progressive signals of said multiplexed signal, by mixing said progressive signals of said multiplexed signal detected by said coupling means with a local oscillation signal having a predetermined local oscillation frequency and band-pass-filtering said first intermediate frequency signal with a predetermined pass band;

second frequency converting means for converting said reflected signals of said multiplexed signal detected by said coupling means into a second intermediate frequency signal relating to said reflected signal of one carrier wave signal preselected among said reflected signals of said multiplexed signal, by mixing said reflected signals of said multiplexed signal detected by said coupling means with said local oscillation signal and band-pass-filtering said second intermediate frequency signal with a predetermined pass band;

detecting means for respectively detecting said first intermediate frequency signal converted by said first frequency converting means and said second intermediate frequency signal converted by said second frequency converting means and outputting said respective detected signals; and calculating means for calculating a standing wave ratio with respect to said preselected one carrier wave signal based on said respective detected signals outputted from said detecting means.

According to a further aspect of the present invention, there is provided an antenna supervising apparatus for supplying a multiplexed signal comprised of a plurality of carrier wave signals respectively outputted from a plurality of transmitters to an antenna and measuring a level of a reflected signal transmitted from said antenna through a transmission line of a radio transmission system for transmitting said multiplexed signal from said antenna to a free space, comprising:

first coupling means provided on said transmission line for detecting said reflected signals of said multiplexed signal;

first frequency converting means for converting one carrier wave sinal outputted from one transmitter preselected among said plurality of transmitters into a first intermediate frequency signal, by mixing said preselected one carrier wave signal with a local oscillation signal having a predetermined local oscillation frequency;

second frequency converting means for converting said reflected signals of said multiplexed signal detected by said first coupling means into a second intermediate frequency signal relating to said reflected signal of said preselected one carrier wave signal, by mixing said reflected signals of said multiplexed signal detected by said first coupling means with said first intermediate frequency signal converted by said first intermediate frequency converting means and band-pass-filtering said second intermediate frequency signal with a predetermined pass band;

first detecting means for detecting said second intermediate frequency signal converted by said second frequency converting means and outputting said detected signal; and first calculating means for calculating a level of said reflected signal with respect to said preselected one carrier wave signal based on said detected signal outputted from said first detecting means.

According to a still further aspect of the present invention, there is provided an antenna supervising apparatus for supplying a multiplexed signal comprised of a plurality of carrier wave signals respectively outputted from a plurality of transmitters to an antenna and measuring a level of a reflected signal transmitted from said antenna through a transmission line of a radio transmission system for transmitting said multiplexed signal from said antenna to a free space, comprising:

first coupling means provided on said transmission line for detecting said reflected signals of said multiplexed signal;

mixing means for mixing one carrier wave signal outputted from one transmitter preselected among said plurality of transmitters with said reflected signals of said multiplexed signal detected by said first coupling means and outputting said mixed signals;

low-pass filtering means for filtering a signal from said mixed signals outputted from said mixing means; and first calculating means for calculating a level of said reflected signal with respect to said preselected one carrier wave signal based on said filtered signal outputted from said low-pass filtering means.

According to a still more further aspect of the present invention, there is provided a standing wave-ratio measuring apparatus comprising a transmission line, one end of which is connected to a load, said apparatus measuring a standing wave ratio with respect to a high frequency signal transmitted on said transmission line based on a level of a progressive signal passing through said transmission line and a level of a reflected signal coming back from said load to said transmission line when said high frequency signal having a predetermined level is inputted to another end of said transmission line, said apparatus comprising:

first coupling means provided on said transmission line for detecting said progressive signal;

second coupling means provided on said transmission line for detecting said reflected signal;

modulating means for angle-modulating said progressive signal detected by said first coupling means according to a signal having a predetermined level and outputting a modulation signal;

mixing means for mixing said reflected signal detected by said second coupling means with said modulation signal outputted from said modulating means and outputting said mixed signals;

low-pass filtering means for filtering a signal from said mixed signals outputted from said mixing means;

rectifying means for rectifying said signal filtered by said low-pass filtering means and outputting a first signal for representing an absolute value of said filtered signal;

integrating means for integrating said first signal outputted from said rectifying means and outputting a second signal for representing a peak value of said first signal;

first calculating means for calculating a level of said progressive signal based on said progressive signal detected by said first coupling means;

second calculating means for calculating a level of said reflected signal based on said second signal outputted from said integrating means; and third calculating means for calculating a standing wave ratio on said transmission line based on the level of said progressive signal calculated by said first calculating means and the level of said reflected signal calculated by said second calculating means.

According to a more still further aspect of the present invention, there is provided a standing wave ratio measuring apparatus comprising a transmission line, one end of which is connected to a load, said apparatus measuring a standing wave ratio with respect to a high frequency signal transmitted on said transmission line based on a level of a progressive signal passing through said transmission line and a level of a reflected signal coming back from said load to said transmission line when said high frequency signal having a predetermined level is inputted to another end of said transmission line, said apparatus comprising:

first coupling means provided on said transmission line for detecting said progressive signal;

second coupling means provided on said transmission line for detecting said reflected signal;

modulating means for angle-modulating said progressive signal detected by said first coupling means according to a signal having a predetermined level and outputting a modulation signal;

mixing means for respectively mixing said reflected signal detected by said second coupling means and said progressive signal detected by said first coupling means with said modulation signal outputted from said modulating means and outputting said respective mixed signals;

low-pass filtering means for respectively filtering respective signals from said respective mixed signals outputted from said mixing means;

rectifying means for respectively rectifying said respective signals filtered by said low-pass filtering means and outputting respective first signals for representing absolute values of said filtered respective signals;

integrating means for respectively integrating said respective first signals outputted from said rectifying means and outputting respective second signals for representing peak values of said respective first signals;

first calculating means for respectively calculating a level of said progressive signal and a level of said reflected signal based on said respective second signals outputted from said integrating means; and second calculating means for calculating a standing wave ratio on said transmission line based on the level of said progressive signal and the level of said reflected signal calculated by said first calculating means.

According to still another aspect of the present invention, there is provided a reflected signal measuring apparatus comprising a transmission line, one end of which is connected to a load, said apparatus measuring a level of a reflected signal coming back from said load to said transmission line when said high frequency signal having a predetermined level is inputted to another end of said transmission line, said apparatus comprising:

first coupling means provided on said transmission line for detecting said progressive signal passing through said transmission line when said high frequency signal is inputted to another end of said transmission line;

second coupling means provided on said transmission line for detecting said reflected signal;

modulating means for angle-modulating said progressive signal detected by said first coupling means according to a signal having a predetermined level and outputting a modulation signal;

mixing means for mixing said reflected signal detected by said second coupling means with said modulation signal outputted from said modulating means and outputting said mixed signals;

low-pass filtering means for filtering a signal from said mixed signals outputted from said mixing means;

rectifying means for rectifying said signal filtered by said low-pass filtering means and outputting a first signal for representing an absolute value of said filtered signal;

integrating means for integrating said first signal outputted from said rectifying means and outputting a second signal for representing a peak value of said first signal; and calculating means for calculating a level of said reflected signal based on said second signal outputted from said integrating means.

According to still more another aspect of the present invention, there is provided a standing wave ratio measuring apparatus used for a transmission system for frequency-multiplexing a plurality of high frequency signals having frequencies different from each other using frequency multiplexing means and supplying a multiplexed signal comprised of said plurality of high frequency signals through a transmission line to a load, said apparatus measuring standing wave ratios on said transmission line with respect to said plurality of high frequency signals, said apparatus comprising:

first coupling means provided on said transmission line for detecting said progressive signal;

second coupling means provided on said transmission line for detecting Said reflected signal;

third coupling means provided on a previous step of said frequency multiplexing means for detecting said respective high frequency signals;

switching for selecting one of said respective high frequency signals detected by said ,third coupling means and outputting said selected high frequency signal;

modulating means for angle-modulating said selected high frequency signal outputted from said switching means according to a signal having a predetermined level and outputting a modulation signal;.

mixing means for respectively mixing said progressive signal by said first coupling means ,and said reflected signal detected by said second coupling means with said modulation signal outputted from said modulating means and outputting said respective mixed signals;

low-pass filtering means for respectively filtering respective signals from said respective mixed signals outputted from said mixing means;

rectifying means for respectively rectifying said respective signals filtered by said low-pass filtering means and outputting respective first signals for representing absolute values of said filtered respective signals;

integrating means for respectively integrating said respective first signals outputted from said rectifying means and outputting respective second signals for representing peak values of said respective first signals;

first calculating means for respectively calculating a level of said progressive signal and a level of said reflected signal based on said respective second signals outputted from said integrating means; and second calculating means for respectively calculating standing wave ratios on said transmission line with respect to said high frequency signals based on the level of said progressive signal and the level of said reflected signal calculated by said first calculating means by controlling said switching means to sequentially select said respective high frequency signals.

According to more still another aspect of the present invention, there is provided a reflected signal measuring apparatus used for a transmission system for frequency-multiplexing a plurality of high frequency signals having frequencies different from each other using frequency multiplexing means and supplying a multiplexed signal comprised of said plurality of high frequency signals through a transmission line to a load, said apparatus measuring levels of a reflected signals with respect to said high frequency signals coming back from said load to said transmission line, said apparatus comprising:

first coupling means provided on said transmission line for detecting said reflected signal;

second coupling means provided on a previous step of said frequency multiplexing means for detecting said respective high frequency signals;

switching for selecting one of said respective high frequency signals detected by said second coupling means and outputting said selected high frequency signal;

modulating means for angle-modulating - said selected high frequency signal outputted from said a signal having a switching means according to predetermined level and outputting a modulation signal;

mixing means for mixing said reflected signal by said first coupling means with said modulation signal outputted from said modulating means and outputting said mixed signal;

low-pass filtering means for filtering a signal from said mixed signal outputted from said mixing means;

rectifying means for rectifying said signal filtered by said low-pass filtering means and outputting a first signal for representing an absolute value of said filtered signal;

integrating means for integrating said first signal outputted from said rectifying means and outputting a second signal for representing a peak value of said first signal; and calculating means for respectively calculating levels of said reflected signals on said transmission line with respect to said high frequency signals based on said second signal outputted from said integrating means by controlling said switching means to sequentially select said respective high frequency signals.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Figure 1:
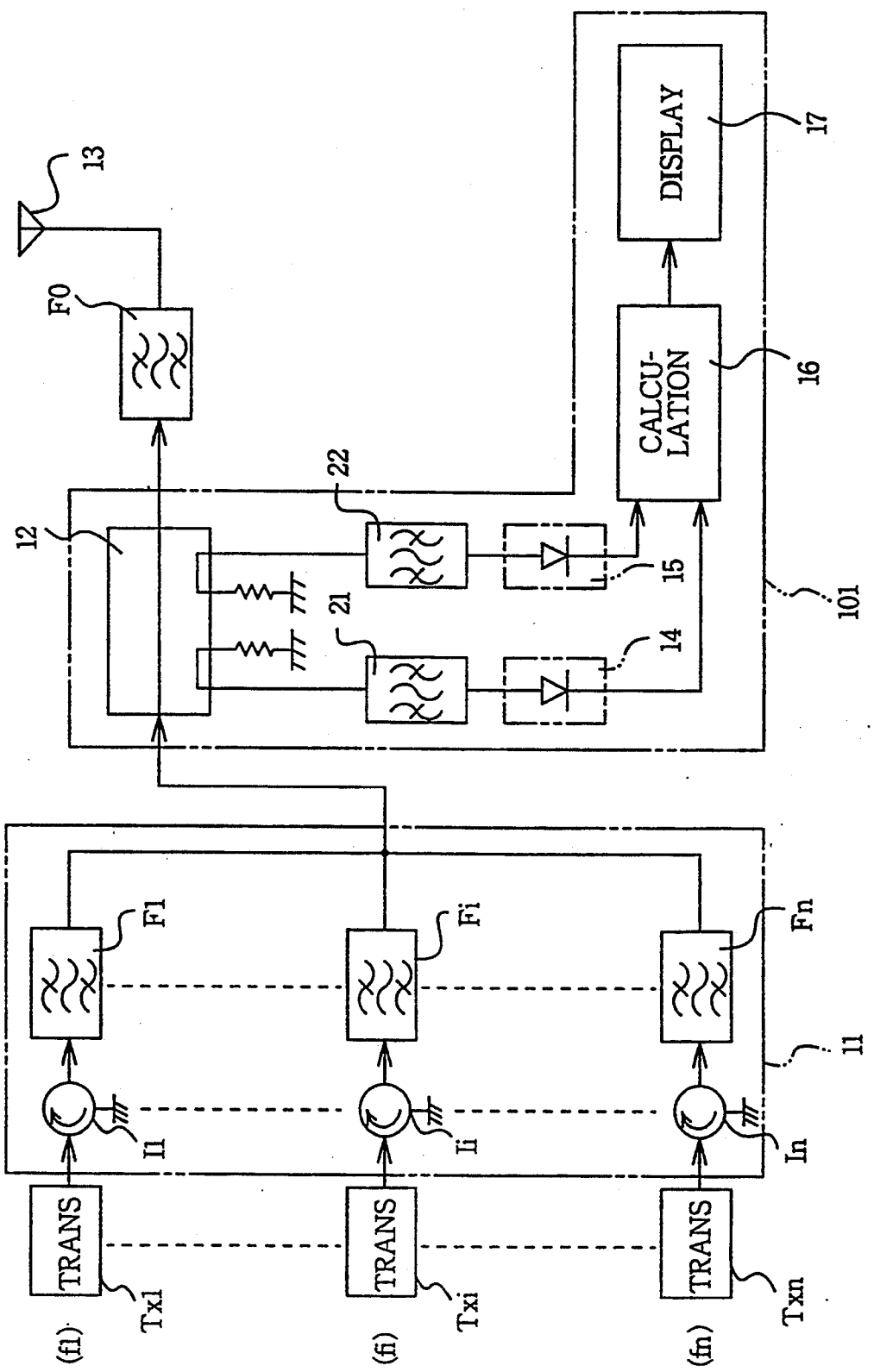
FIG. 1 is a schematic block diagram showing an antenna supervising apparatus of first and second preferred embodiments according to the present invention.

The preferred embodiments according to the present invention will be described below with reference to the attached drawings. First preferred embodiment FIG. 1 shows an antenna supervising apparatus 101 of a first preferred embodiment according to the present invention. In FIG. 1, sections corresponding to those shown in FIG. 8 are denoted by the same numerals as those shown in FIG. 8.

Figure 8:
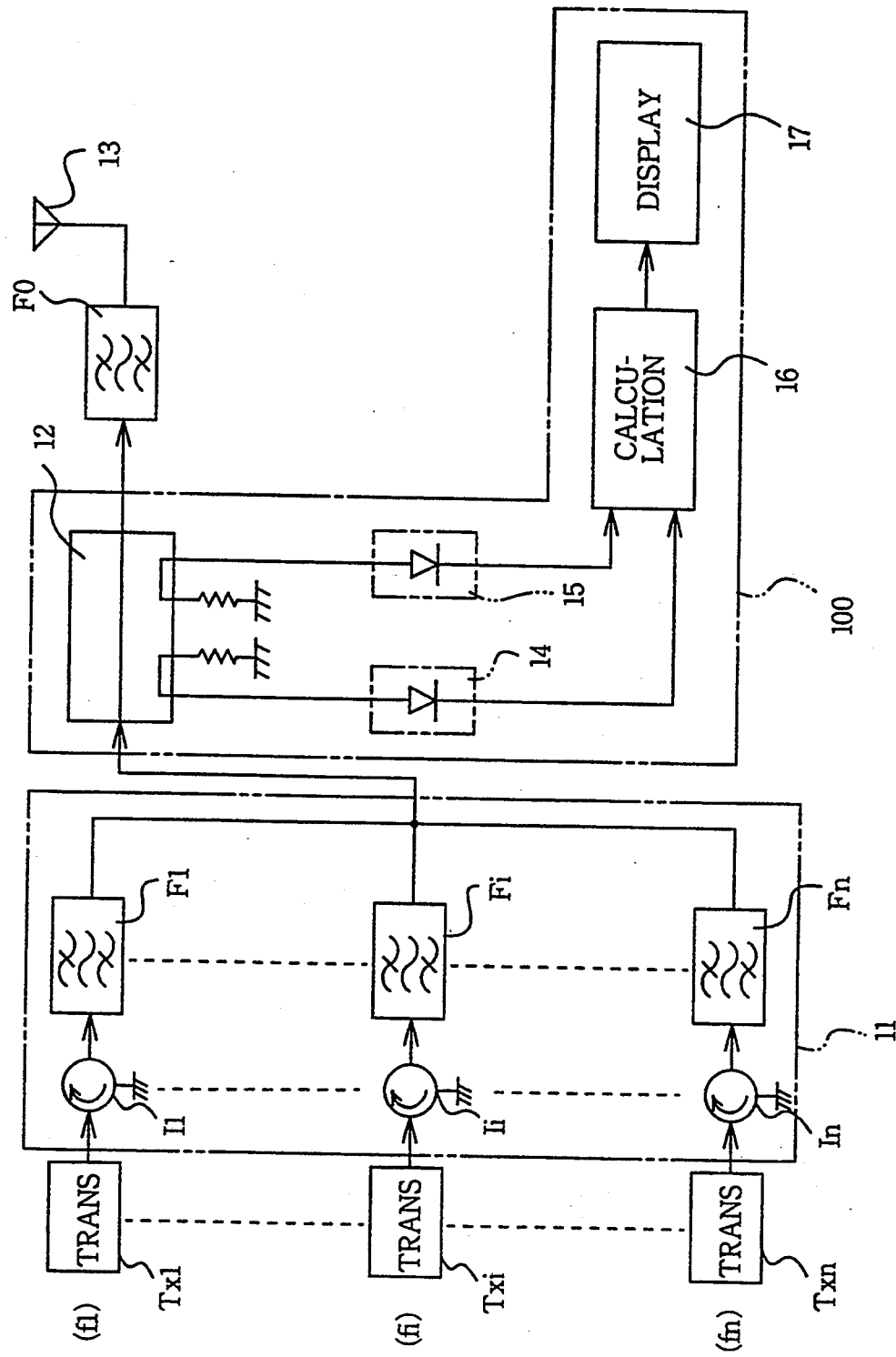
FIG. 8 is a schematic block diagram showing a base station apparatus and an antenna supervising apparatus which are provided in the cellular radio zone type mobile radio communication system shown in FIG. 7.
Figure 9:
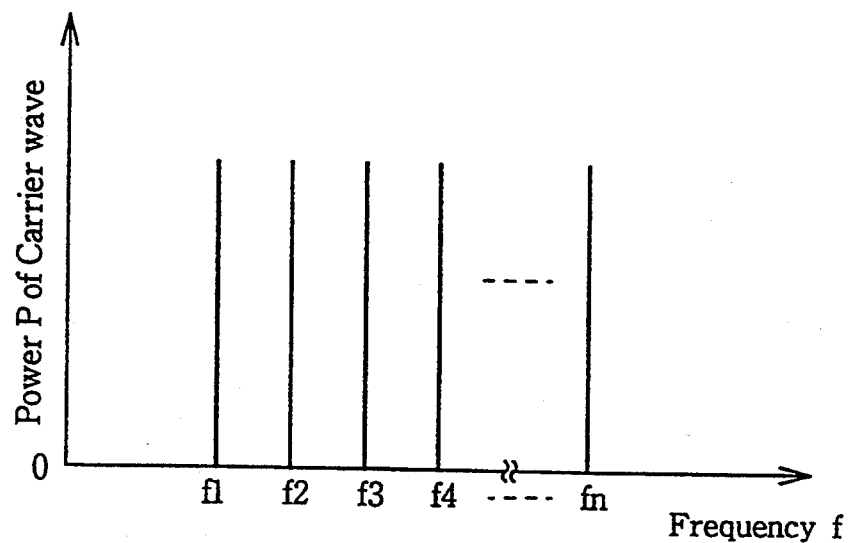
FIG. 9 is a graph showing a spectrum of a carrier wave used in the base station shown in FIG. 8.
Figure 10:
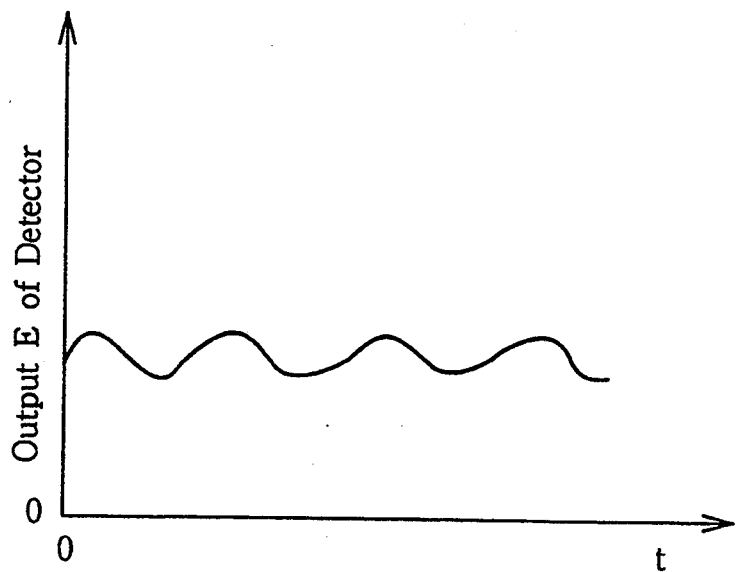
FIG. 10 is a graph showing a detector output including beat components in the antenna supervising apparatus shown in FIG. 8.

As is apparent from comparison between the antenna supervising apparatus 101 of the present preferred embodiment and the conventional antenna supervising apparatus 100 shown in FIG. 8, the antenna supervising apparatus 101 of the present preferred embodiment is characterized in that, a band-pass filter 21 for band-pass-filtering a progressive wave of a carrier wave having, for example, the frequency f1 outputted from the transmitter Tx1, which is selected among the carrier waves having the frequencies f1 to fn outputted from the plural transmitter Tx1 to Txn, is inserted between the directional coupler 12 and the detector 14 for detecting the progressive wave, and also a band-pass filter 22 for band-pass filtering a reflected wave of the carrier wave having the frequency f1 transmitted from the transmitter Tx1 is inserted between the directional coupler 12 and the detector 15 for detecting the reflected wave.

In the antenna supervising apparatus 101 constructed as described above, since only the progressive wave of the carrier wave having the frequency f1 transmitted to the antenna 13 and the reflected wave thereof coming back from the antenna 13 are detected by band-pass operations of the band-pass filters 21 and 22, there is no influence of beat signals caused by the carrier wave having the frequency f1 and another carrier wave having a frequency f2, f3, ..., or fn. In this case, precision of detecting the progressive wave and the reflected wave are heightened. Then, precision of detecting the high frequency power and the VSWR on the transmission line located from the directional coupler 12 to the antenna 13 can be improved.

Second preferred embodiment

In a second preferred embodiment, there is used tuneable band-pass filters, pass band of each of which can be controlled by a control signal inputted from an external unit, as the band-pass filters 21 and 22 of the antenna supervising apparatus 101 of the first preferred embodiment. As a tuneable band-pass filter, there can be used, for example, a band-pass filter comprising a dielectric resonator of $TE_{01\delta}$ mode.

In the antenna supervising apparatus of the second preferred embodiment constructed as described above, when the frequencies of the carrier waves outputted from the base station 2 are altered, measures can be easily taken soon. If this frequency control is performed by a remote control system, measures can be taken for an uninhabited base station.

Third preferred embodiment

Figure 2:
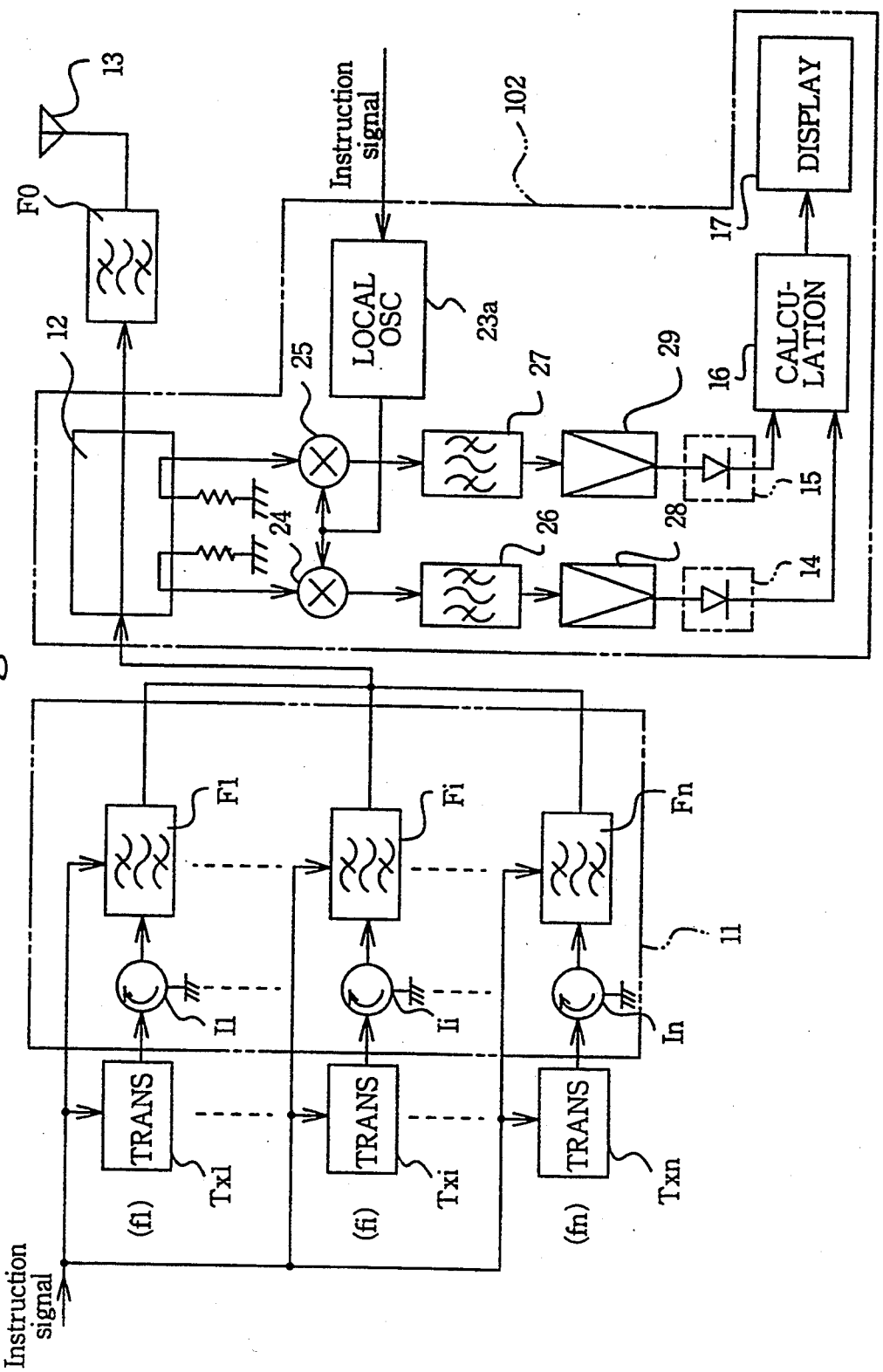
FIG. 2 is a schematic block diagram showing an antenna supervising apparatus of a third preferred embodiment according to the present invention.

FIG. 2 shows an antenna supervising apparatus 102 of a third preferred embodiment according to the present invention. In FIG. 2, sections corresponding to those shown in FIG. 8 are denoted by the same numerals as those shown in FIG. 8, and the same description is omitted herein.

The antenna supervising apparatus 102 of the present preferred embodiment is characterized in that, a mixer 24, a band-pass filter 26 and an intermediate frequency amplifier 28 are connected between the directional coupler 12 and the detector 14 for detecting the progressive wave, and also a mixer 25, a band-pass filter 27 and an intermediate frequency amplifier 29 are connected between the directional coupler 12 and the detector 15 for detecting the reflected wave. An intermediate frequency is referred to as an IF hereinafter.

The mixer 24 mixes the progressive wave of the multiplexed wave detected by the directional coupler 12 with a local oscillation signal having a predetermined local oscillation frequency generated by a local oscillator 23a, and outputs signals of a mixed or multiplication result to the band-pass filter 26. Thereafter, the band-pass filter 26 band-pass-filters and takes out only an IF signal having a predetermined intermediate frequency from the inputted signals having the mixed result, and outputs the filtered IF signal through the IF amplifier 28 to the detector 14. Therefore, only the IF signal having a level in proportion to that of the progressive wave of a carrier wave, a difference between the frequency of which and the local oscillation frequency of the local oscillation signal becomes the above-mentioned intermediate frequency, can be extracted by a frequency conversion circuit comprising the mixer 24 and the band-pass filter 26, from the progressive wave of the multiplexed wave comprised of the carrier waves having the frequencies f1 to fn outputted from the plural transmitters Tx1 to Txn.

Similarly, the mixer 25 mixes the reflected wave of the multiplexed wave detected by the directional coupler 12 with the local oscillation signal outputted from the local oscillator 23a, and outputs signals having a mixed or multiplication result to the band-pass filter 27. Thereafter, the band-pass filter 27 band-pass-filters and takes out only an IF signal having a predetermined intermediate frequency from the inputted signals having the mixed result, and outputs it through the IF amplifier 29 to the detector 15. Therefore, only the IF signal having a level in proportion to that of the reflected wave of a carrier wave, a difference between the frequency of which and the local oscillation frequency of the local oscillator 23a becomes the above-mentioned intermediate frequency, can be extracted by another frequency conversion circuit comprising the mixer 25 and the band-pass filter 27, from the reflected wave of the multiplexed wave comprises of the carrier waves having the frequencies f1 to fn outputted from the transmitters Tx1 to Txn.

Figure 3:
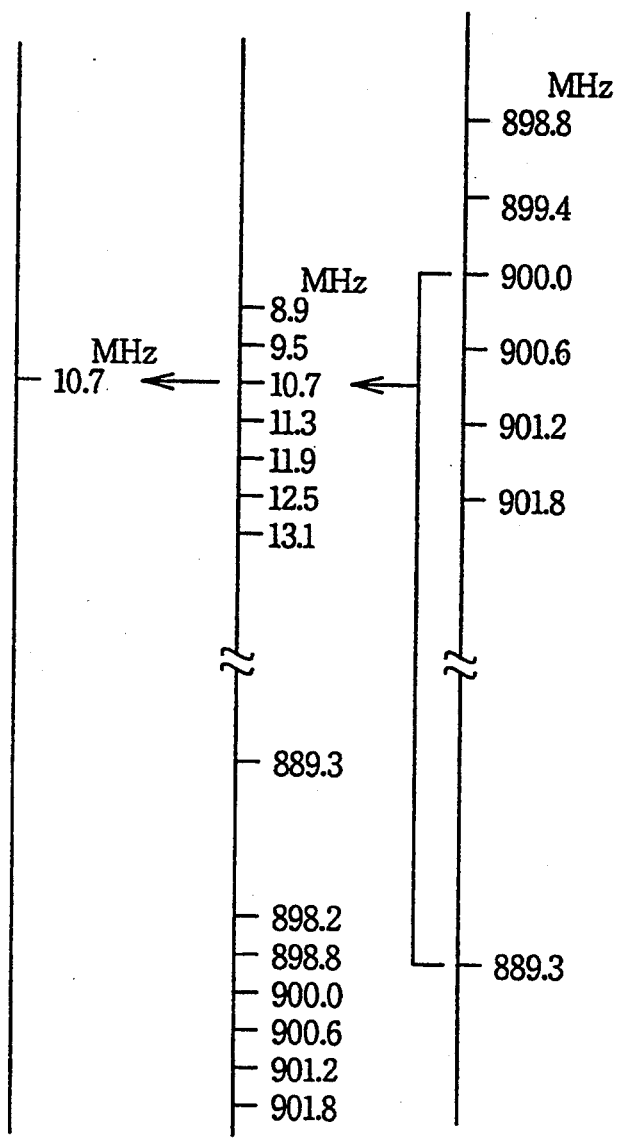
FIG. 3 is a frequency conversion diagram showing an operation of the antenna supervising apparatus shown in FIG. 2.

FIG. 3 shows one example of a frequency conversion performed by each of the frequency conversion circuit comprising the mixers 24 and the band-pass filter 26 and another frequency conversion circuit comprising the mixer 25 and the band-pass filter 27, which are provided in the antenna supervising apparatus 102. In this example, 10.7 MHz is selected as the above-mentioned two intermediate frequencies and the center frequency of the pass band of each of the band-pass filters 26 and 27.

In this case, when the IF signals of the reflected wave and progressive wave transmitted on the transmission line connected to the antenna 13, which correspond to a carrier wave of 900.0 MHz outputted from a transmitter Txi, are detected, a frequency which is higher or lower than 900.0 MHz by 10.7 MHz, namely, 900.0 MHz±10.7 MHz is selected as the local oscillation frequency of the local oscillator 23a. In this example, 889.3 MHz is selected as the local oscillation frequency.

When the reflected wave and the progressive wave of the multiplexed wave comprised of the carrier waves having frequencies of 898.8 MHz, 899.4 MHz, 900.0 MHz, . . . , 901.8 MHz outputted from the transmitters Tx1, . . . , Txi, . . . , Txn are mixed with the local oscillation signal having the local oscillation frequency of 889.3 MHz by the mixers 24 and 25, only the respective IF signals of 10.7 MHz of the progressive wave and the reflected wave corresponding to the carrier wave having the frequency of 900.0 MHz are outputted from the band-pass filters 26 and 27. Thereafter, these IF signals are respectively amplified by the IF amplifiers 28 and 29. In this case, the output of the IF amplifier 28 is in proportion to the level of the progressive wave corresponding to the carrier wave having the frequency of 900.0 MHz, and the output of the IF amplifier 29 is in proportion to the level of the reflected wave corresponding to the carrier wave having the frequency of 900.0 MHz.

Therefore, when the outputs of the IF amplifiers 28 and 29 are respectively detected by the detectors 14 and 15, there can be measured the levels of the progressive wave of a carrier wave transmitted from a transmitter Txi to the antenna 13 and the reflected wave coming back from the antenna 13, in form of levels of direct-current voltages. In a manner similar to that known to those skilled in the art, the calculation circuit 16 calculates a VSWR of an antenna system including the antenna 13 and a transmission line located from the directional coupler 12 to the antenna 13 from the these levels of the progressive wave and the reflected wave, and also calculates a high frequency power projected from the antenna 13 to a free space from the level of the progressive wave. Thereafter, the calculation result of the calculation circuit 16 is displayed on the display unit 17 such as a CRT display, and is further recorded by a printer (not shown).

Further, the frequency of the carrier wave of the progressive wave and the reflected wave to be measured among the multiplexed wave can be altered by altering the local oscillation frequency of the local oscillation signal generated by the local oscillator 23a so that a difference between the frequency of the carrier wave and the local oscillation frequency becomes the above-mentioned predetermined intermediate frequency, for example, in response to an instruction signal inputted from an external apparatus.

In the antenna supervising apparatus 102 shown in FIG. 2, since the carrier wave having a relatively high frequency which is close to the frequency of the adjacent carrier wave is converted into the IF signal having a relatively low frequency of 10.7 MHz which can be easily processed, it is unnecessary to provide band-pass filters each having a relatively high no-loaded Q (Q0) as the bandpass filters 26 and 27, and also the high frequency power and the VSWR can be easily measured correctly without receiving any influence of beat signals.

Figure 7:
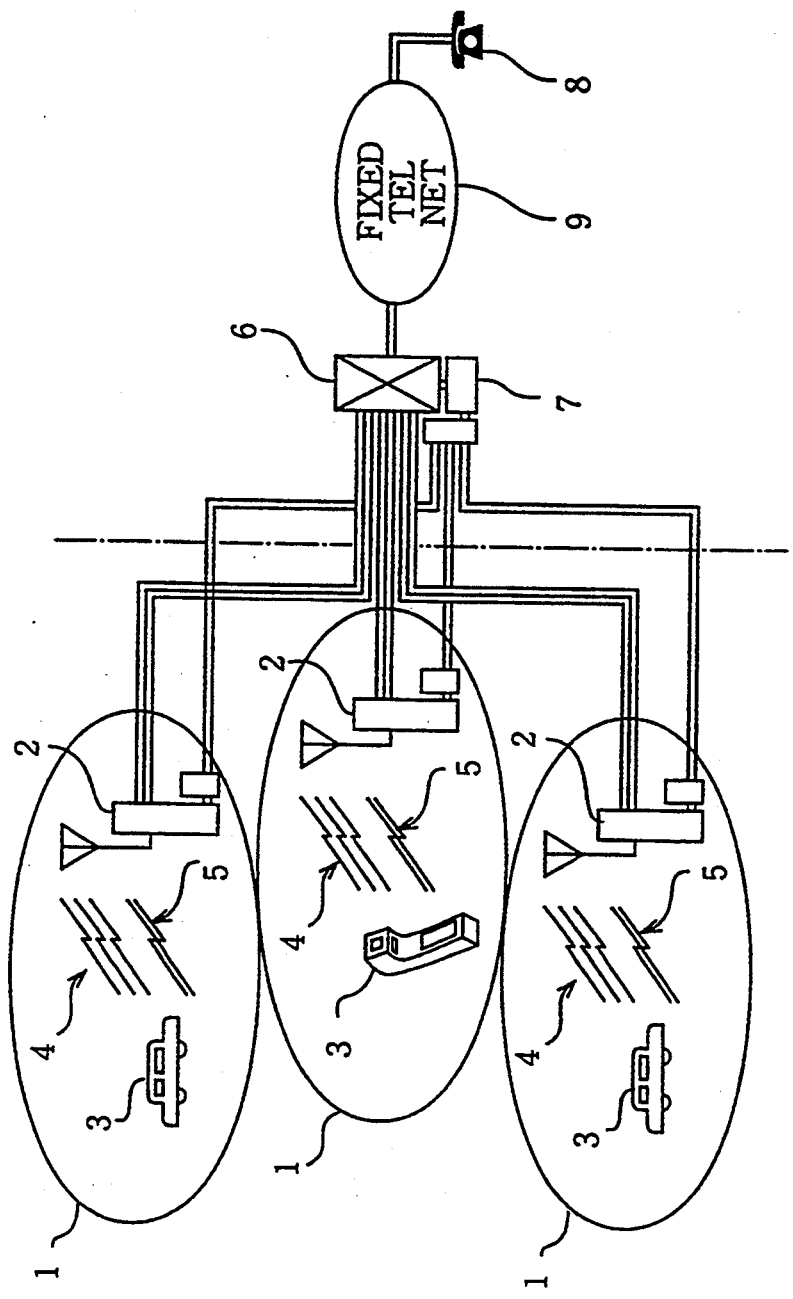
FIG. 7 is a schematic diagram showing a conventional cellular radio zone type mobile radio communication system.

In the third preferred embodiment shown in FIG. 2, when the frequency of the carrier wave is altered in response to the instruction signal transmitted from the exchange control station 6 (See FIG. 7), the local oscillation frequency of the local oscillation circuit 23a is altered using the instruction signal according to the alteration of the frequency of the carrier wave.

Fourth preferred embodiment

Figure 4:
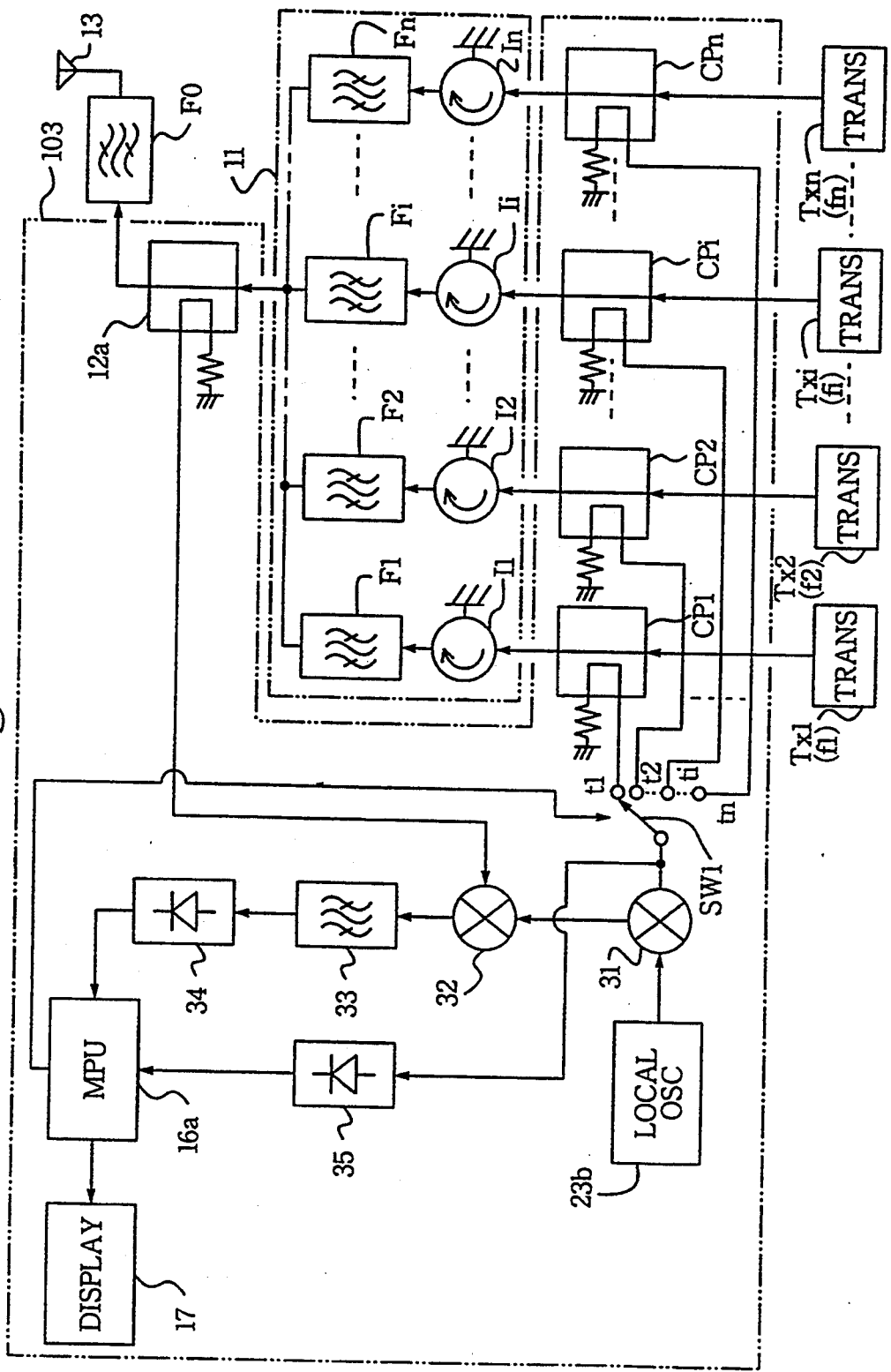
FIG. 4 is a schematic block diagram showing an antenna supervising apparatus of a fourth preferred embodiment according to the present invention.

FIG. 4 shows an antenna supervising apparatus 103 of a fourth preferred embodiment according to the present invention. In FIG. 4, sections corresponding to those shown in FIG. 8 are denoted by the same numerals as those shown in FIG. 8, and the same description is omitted herein.

In the antenna supervising apparatus 103 of the present preferred embodiment, a natural number n of directional couplers CPi (i=1, 2, ..., n) each comprising a coupling line for detecting a carrier wave having a frequency fi outputted from the transmitter Txi are provided between respective isolators I1, ..., Ii, ..., In of the transmitter combiner 11 and respective transmitters Tx1, ..., Txi, ..., Txn in the antenna supervising apparatus 100 shown in FIG. 8. The progressive waves of the respective carrier waves having the frequencies f1, ..., fi, ..., fn outputted from the respective transmitters Tx1, ..., Txi, ..., Txn are inputted to terminals t1, t2, ti, ..., tn of a switch SW1, respectively, and then, one of the progressive waves of the carrier waves is selected by the switch SW1 which is controlled by an micro processing unit (referred to as an MPU hereinafter) 16a and is outputted to a first mixer 31 and a detector 35. The detector 35 detects the inputted progressive wave of the carrier wave having a frequency fi and outputs a detected signal to the MPU 16a.

The antenna supervising apparatus 103 comprises:

(a) the first mixer 31 for mixing the progressive wave of the carrier wave having the frequency fi outputted from the transmitter Txi which is inputted from the directional coupler CPi through the switch SW1 with a local oscillation signal having a predetermined local oscillation frequency generated by a local oscillator 23b and outputting a first IF signal having the mixed or multiplication result;

(b) a second mixer 32 for mixing the output of the mixer 31 with the reflected wave of the multiplexed wave comprised of the respective carrier waves having the frequencies f1 to fn outputted from the transmitters Tx1 to Txn which is detected by a directional coupler 12a provided between the transmitter combiner 11 and the antenna filter F0; and (c) a band-pass filter 33 for band-pass-filtering the output of the second mixer 32 and outputting only a second IF signal through a detector 34 to the MPU 16a.

There can be obtained a signal in proportion to the level of a reflected wave having the frequency fi among the multiplexed wave reflected from the antenna 13, which corresponds to the carrier wave having the frequency fi selected by the switch SW1, as the output of the IF band-pass filter 33. Therefore, when the output of the band-pass filter 33 is detected by the detector 34, there can be detected the level of the reflected wave selected by the switch SW1, in a form of a direct-current voltage, from the detector output of the detector 34.

Figure 5:
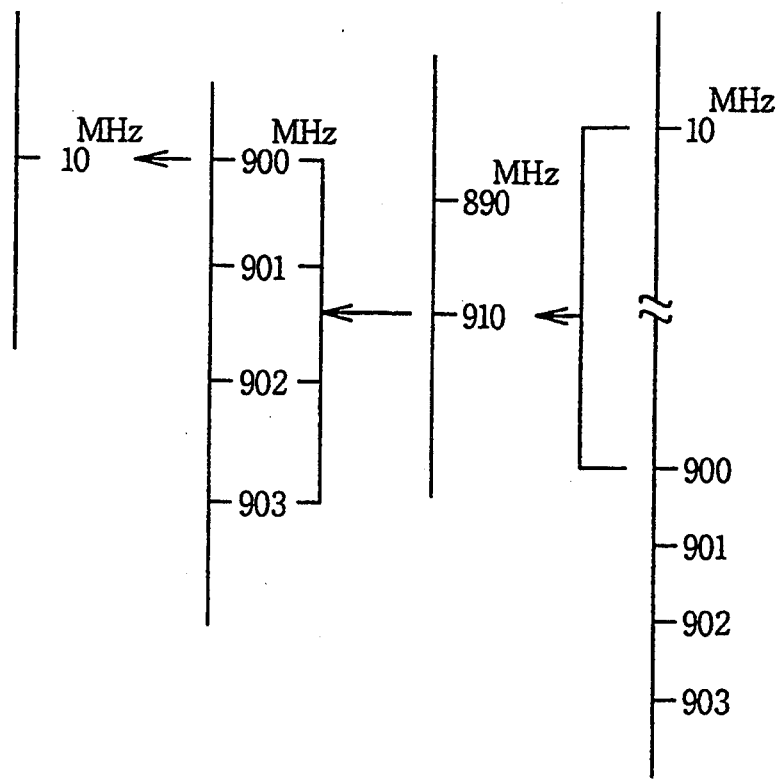
FIG. 5 is a frequency conversion diagram showing an operation of the antenna supervising apparatus shown in FIG. 4.

FIG. 5 shows one example of a frequency conversion performed by the first mixer 31, the second mixer 32 and the band-pass filter 33. In this example, 10 MHz is selected as the local oscillation frequency of the local oscillator 23b.

Referring to FIG. 5, when the carrier wave having the frequency of 900.0 MHz outputted from the transmitter Txi is mixed with the local oscillation signal having the local oscillation frequency of 10 MHz by the first mixer 1, the carrier wave having the frequency of 900.0 MHz is converted into the first IF signals having the frequencies of 910.0 MHz and 890.0 MHz. Thereafter, the first IF signals are mixed with the reflected wave of the multiplexed wave comprised of the respective carrier waves having the frequencies of 900.0 MHz, 901.0 MHz, ..., 903.0 MHz outputted from the transmitters Tx1, ..., Txi, ..., Txn which is detected by the directional coupler 12 provided between the transmitter combiner 11 and the antenna filter F0, by the second mixer 32, so as to converted into the second IF signals. From the converted second IF signals, only the second IF signal having a frequency of 10.7 MHz is band-pass-filtered and taken out by the band-pass filter 33. In this case, the second IF signal outputted from the band-pass filter 33 corresponds to the carrier wave having the frequency fi selected by the switch SW1 among the above-mentioned multiplexed wave, and is in proportion to the level of the reflected wave having the frequency f1. Therefore, when the filtered second IF signal is detected by the detector 34, there can be measured the level of one reflected wave corresponding to the carrier wave selected by the switch SW1 in a form of a level of a direct-current voltage.

In the antenna supervising apparatus 103 constructed as described above, since one reflected wave selected by the switch SW1 among the multiplexed wave comprised of the above-mentioned carrier waves having the relatively high frequencies each frequency close to that of the adjacent carrier wave is converted into the IF signal having the relatively low frequency which can be easily processed, it is unnecessary to provide a band-pass filter having a relatively high no-loaded Q ($Q_0$). Further, the respective reflected waves of the multiplexed wave from the antenna system can be supervised without receiving any influence of interference signals and beat signals, by sequentially switching the switch SW1.

Further, based on the above-mentioned reflected signal and a direct-current voltage corresponding to the level-of the progressive wave of the carrier wave which is detected by the directional coupler CPi and the detector 35, there is calculated a VSWR of the antenna system including the antenna 13 and the transmission line located from the directional coupler 12a to the antenna 13 and an effective high frequency power projected from the antenna 13 toward a free space by the MPU 16a in a manner similar to that known to those skilled in the art, and further, the calculation result is displayed on the display unit 17.

It is to be noted that, if the MPU 16a is constituted by a digital processor, there is provided analogue to digital converters between the detector 34 and the MPU 16a, and between the detector 35 and the MPU 16a, and then, the above-mentioned calculation and control process is performed by a digital process.

In the antenna supervising apparatus 103 of the present preferred embodiment, even though the carrier wave outputted from the transmitter Txi is a modulation signal such as an FM signal, an MSK signal, a GMSK signal, the modulation component of the second IF signal outputted from the band-pass filter 33 is canceled by an-action of the second mixer 32 so that only a main carrier wave component is outputted from the band-pass filter 33, and then, there is no change in the detector output due to the modulation. In this case, there is such an advantage that a precision of detecting the level of the reflected wave can be remarkably improved.

Fifth preferred embodiment

Figure 6:
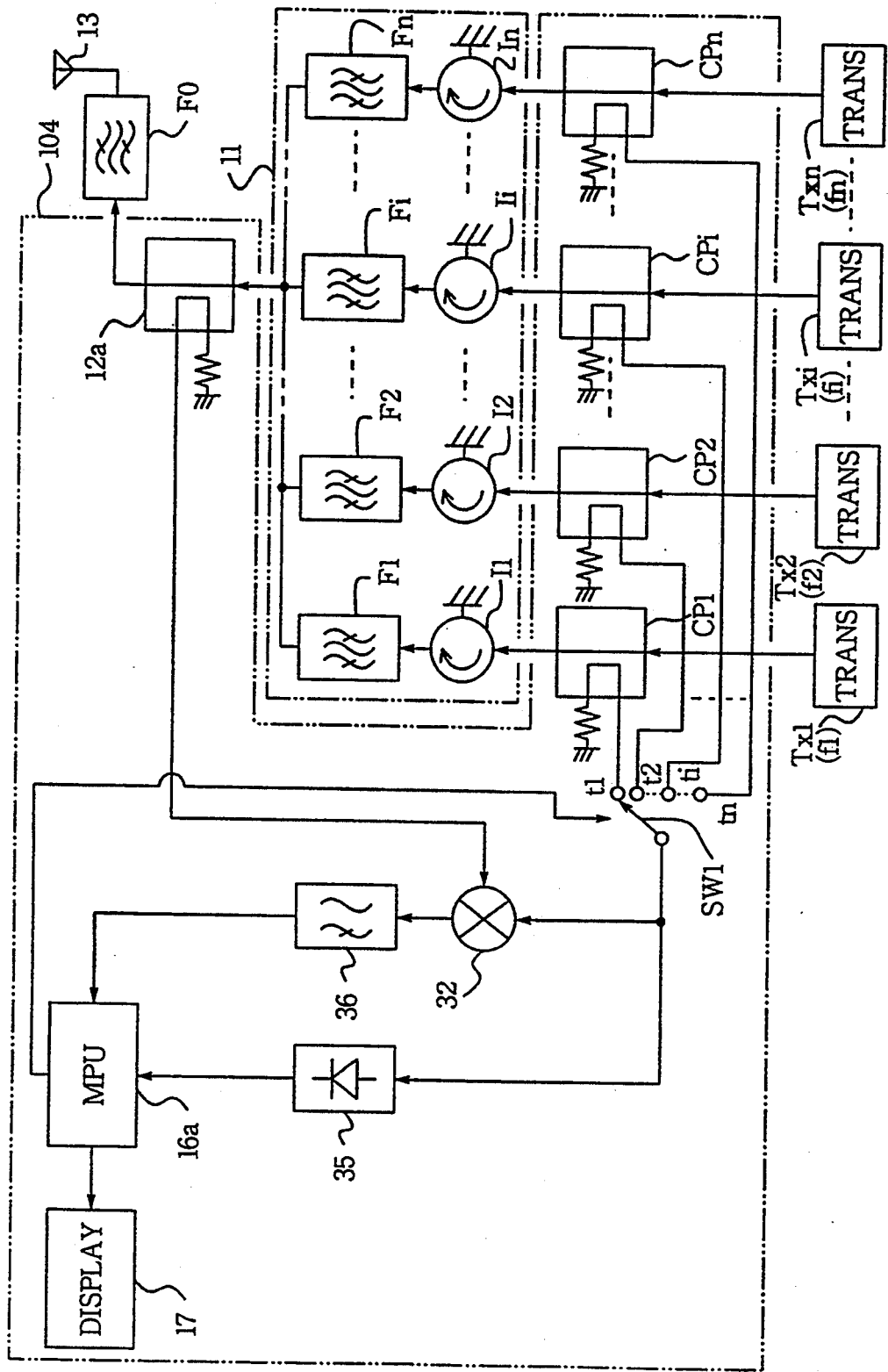
FIG. 6 is a schematic block diagram showing an antenna supervising apparatus of a fifth preferred embodiment according to the present invention.

FIG. 6 shows an antenna supervising apparatus 104 of a fifth preferred embodiment according to the present invention. In FIG. 6, sections corresponding to those shown in FIG. 4 are denoted by the same numerals as those shown in FIG. 4, and the same description is omitted herein.

In the antenna supervising apparatus 104 of the present preferred embodiment, the progressive wave transmitted from one transmitter Txi to the antenna system which is detected by the directional coupler CPi is mixed with the reflected wave of the multiplexed wave comprised of the carrier waves having the frequencies f1 to fn outputted from the plural transmitters Tx1 to Txn by a mixer 32 of a double balanced mixer, the output of the mixer 32 is inputted through a low-pass filter 36 to the MPU 16a, and then, there is detected a direct-current voltage signal in proportion to the level of one reflected wave having the frequency fi corresponding to the carrier wave having the frequency fi selected by the switch SW1.

Further, the progressive wave transmitted from the transmitter Tx1 to the antenna system which is detected by the directional coupler CPi is inputted through the switch SW1 to the detector 35, and is detected by the detector 35 so that the detector output is inputted to the MPU 16a. In a manner similar to that known to those skilled in the art, the MPU 16a calculates a VSWR of the antenna system including the antenna 13 and the transmission line located from the directional coupler 12a to the antenna 13 and a high frequency power projected from the antenna 13 toward a free space, from a direct-current voltage signal in proportion to the level of the reflected wave selected by the switch SW1 which is outputted from the low-pass filter 36 and the output of the detector 35.

FIG. 5 shows one example of a frequency conversion performed by the mixer 32.

Referring to FIG. 5, when the carrier wave having the frequency of, for example, 900.0 MHz outputted from the transmitter Txi selected among the transmitters for outputting the carrier waves having the frequencies of 900.0 MHz, 901.0 MHz, 902.0 MHz and 903.0 MHz, and the multiplexed wave of the above-mentioned transmitters Tx1 to Txn are inputted to the mixer 32, the mixer 32 outputs IF signals having frequencies of differences between (900.0 MHz, 901.0 MHz, 902.0 MHz and 903.0 MHz) and (900.0 MHz) and sums thereof, such as a direct-current signal, signals having frequencies of 1 MHz, 2 MHz, 3 MHz and 1.8 GHz band. Thereafter, when the output of the mixer 32 is passed through the low-pass filter 36 having a cut-off frequency of about 20 kHz, the above-mentioned direct-current signal is obtained from the output of the low-pass filter 36, wherein the level of the direct-current signal is in proportion to the level of one reflected wave selected by the switch SW1 among the multiplexed wave. The antenna supervising apparatus 104 constructed as described above has a structure simpler than that of the antenna supervising apparatus 103 shown in FIG. 4, and there is easily calculated a VSWR of the antenna system and a high frequency power projected from the antenna 13 toward a free space without providing a band-pass filter having a relatively high no-loaded Q ($Q_0$).

In the antenna supervising apparatus 104 of the present preferred embodiment, even though the carrier wave outputted from the transmitter Txi is a modulation signal such as an FM signal, an MSK signal, a GMSK signal, the modulation component of the direct-current signal outputted from the low-pass filter 36 is canceled by an action of the mixer 32 so that only a main carrier wave component is outputted from the low-pass filter 36, and then, there is no change in the filtered output due to the modulation. In this case, there is such an advantage that a precision of detecting the level of the reflected wave can be remarkably improved.

Sixth preferred embodiment

Figure 11:
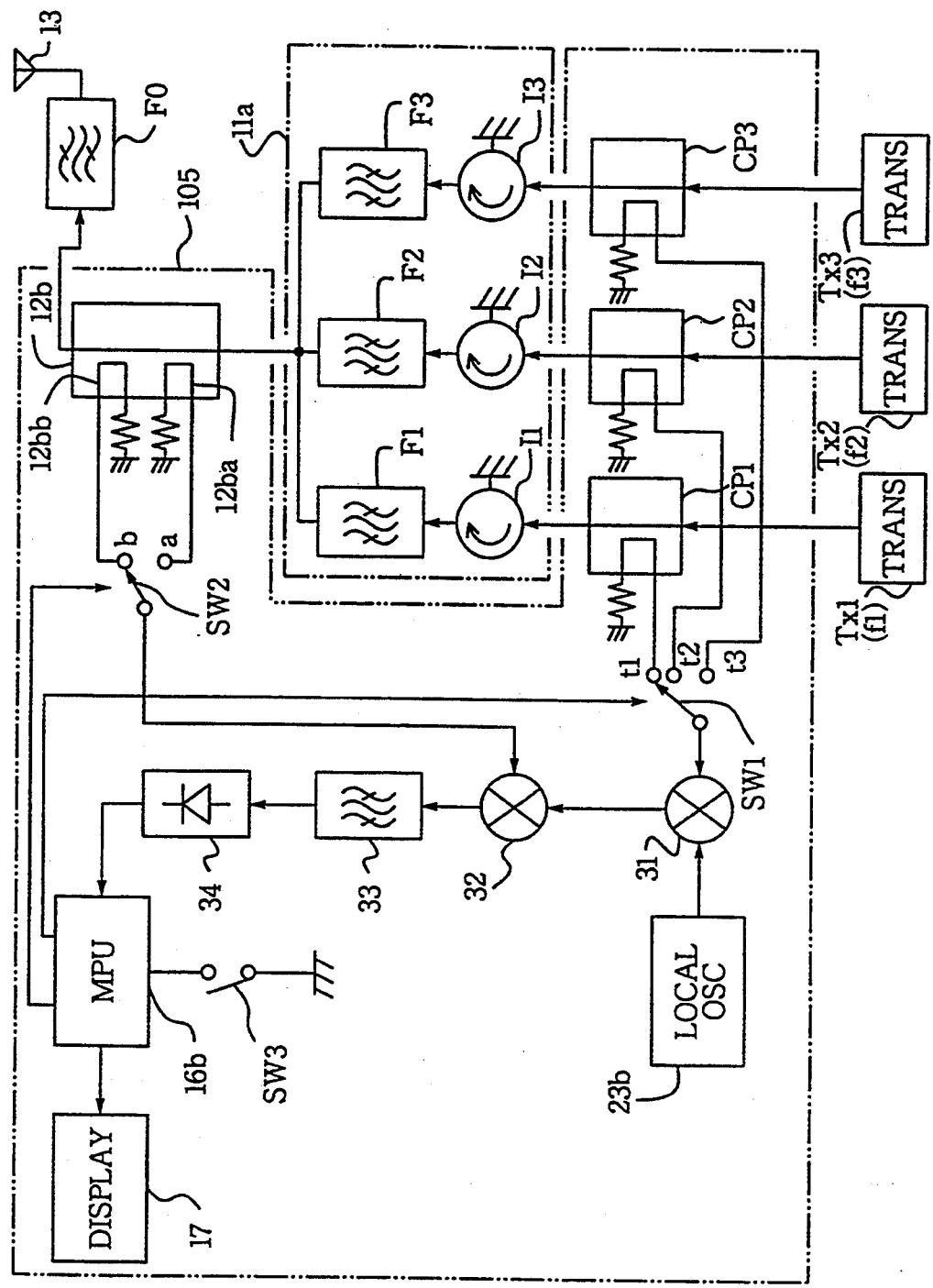
FIG. 11 is a schematic diagram showing an antenna supervising apparatus of a sixth preferred embodiment according to the present invention.

FIG. 11 shows an antenna supervising apparatus 105 of a sixth preferred embodiment according to the present invention. In FIG. 11, sections corresponding to those shown in FIG. 4 are denoted by the same numerals as those shown in FIG. 4, and the same description is omitted herein.

The features of the antenna supervising apparatus 105 of the present preferred embodiment which are differences between the present preferred embodiment and the fourth preferred embodiment shown in FIG. 4 are as follows.

(a) In stead of the directional coupler 12a, there is provided a directional coupler 12b comprising two coupling lines 12ba and 12bb for respectively detecting the progressive wave and the reflected wave of the multiplexed wave comprised of the above-mentioned carrier waves, and also is provided a switch SW2 controlled by an MPU 16b, for selectively outputting one of the progressive wave and the reflected wave respectively detected by the coupling lines 12ba and 12bb to the mixer 32. There is not provided the detector 35. The directional coupler 12b is provided on a transmission line located from the output terminal of the transmitter combiner 11a to the antenna filter F0, and the above-mentioned coupling lines 12ba and 12bb are provided so as to respectively detect the progressive wave and the reflected wave by electromagnetically coupling a pass line of the directional coupler 12b which is a part of the above-mentioned transmission line.

(b) In stead of the MPU 16a, there is provided the MPU 16b for controlling respective sections provided in the antenna supervising apparatus 105 and calculating a VSWR etc. on the transmission line. It is to be noted that a start switch SW3 for staring a process of the MPU 16b is connected to the MPU 16b.

(c) In order to simplify the description, a transmitter combiner 11a comprises three band-pass filters F1 to F3 and three isolators I1 to I3, and the antenna supervising apparatus 105 comprises three directional couplers CP1 to CP3. It is to be noted that the switch SW1 comprises three input terminals t1 to t3.

In the antenna supervising apparatus 105 constructed as described above, when the switch SW2 is switched over to an a-side after switching the switch SW1 to, for example, a t1-side, there can be obtained a signal in proportion to the level of the progressive wave having the frequency f1 in the directional coupler 13 among the multiplexed wave comprised of the progressive waves of the carrier waves transmitted from the directional coupler 12b to the antenna 13, which corresponds to the carrier wave having the frequency f1 selected by the switch SW1, as the output of the IF band-pass filter 33 by a frequency conversion circuit comprising the first mixer 31, the second mixer 32 and the band-pass filter 33, in a manner similar to that of the fourth preferred embodiment shown in FIG. 4. Therefore, when the output of the IF band-pass filter 33 is detected by the detector 34, there can be detected the level of the progressive wave of the carrier wave having the selected frequency f1 from the output of the detector 34, in a form of a direct-current voltage signal.

Thereafter, when the switch SW2 is switched over to a b-side, there can be obtained a signal in proportion to the level of the reflected wave having the frequency f1 in the directional coupler 13 among the multiplexed wave comprised of the reflected waves of the carrier waves transmitted from the directional coupler 12b to the antenna 13, which corresponds to the carrier wave having the frequency f1 selected by the switch SW1, as the output of the IF band-pass filter 33 by the frequency conversion circuit comprising the first mixer 31, the second mixer 32 and the band-pass filter 33, similarly. Therefore, when the output of the IF band-pass filter 33 is detected by the detector 34, there can be detected the level of the reflected wave of the carrier wave having the selected frequency f1 from the output of the detector 34, in a form of a direct-current voltage signal.

In the sixth preferred embodiment, since there is measured the respective levels of the progressive wave and the reflected wave of selected one frequency in the directional coupler 13, there can be measure a VSWR of the antenna system seen from the directional coupler 13 toward the antenna 13. Further, when an interference wave having a frequency different from that of a carrier wave to be measured is inputted from an external system to the antenna 13, the signal relating to the above interference wave which is outputted from the second mixer 32 is eliminated by the band-pass filter 33. Therefore, the antenna supervising apparatus 105 of the present preferred embodiment can measure the VSWR corresponding to the carrier wave having each frequency without receiving any influence of an interference wave.

In the antenna supervising apparatus 105 of the present preferred embodiment, even though the carrier wave outputted from the transmitter Txi (i=1, 2, 3) is a modulation signal such as an FM signal, an MSK signal, a GMSK signal, the modulation component of the second IF signal outputted from the second mixer 32 is canceled by an action of the second mixer 32 and the band-pass filter 33 so that only a main carrier wave component is outputted from the band-pass filter 33, and then, there is no change in the detected output due to the modulation. In this case, there is such an advantage that a precision of detecting the levels of the progressive wave and the reflected wave can be remarkably improved.

The MPU 16b of the present preferred embodiment executes a main routine of a VSWR measuring process described in detail below.

Figure 13:
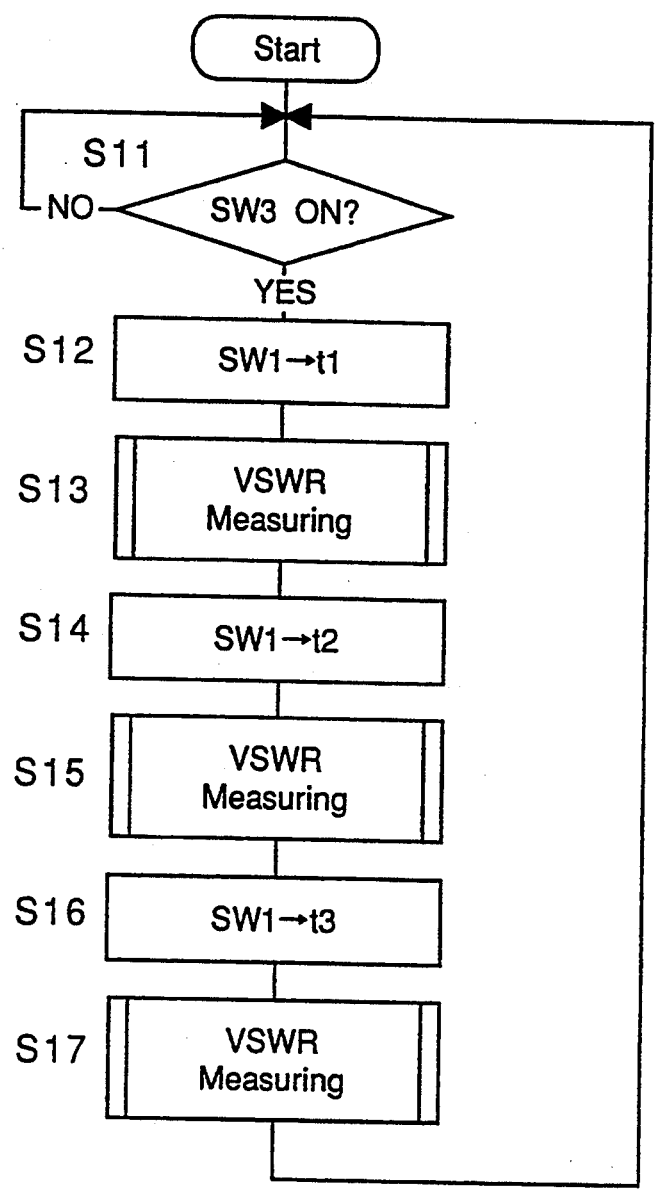
FIG. 13 is a flowchart showing a main routine executed by a micro processing unit of the antenna supervising apparatus shown in FIGS. 11 and 12.

FIG. 13 is a flowchart showing a main routine of the VSWR measuring process executed by the MPU 16b of the antenna supervising apparatus 105 of the sixth preferred embodiment. The main routine is a process for measuring the levels of the progressive waves outputted from the respective transmitters Tx1 to Tx3 through the respective directional couplers CP1 to CP3 of the antenna supervising apparatus 105, the transmitter combiner 11a, the directional coupler 12b of the antenna supervising apparatus 105 and the antenna filter F0 to the antenna 13, and the levels of the reflected waves coming back from the antenna 13, and thereafter, calculating a VSWR corresponding to the respective carrier waves based on the measured levels.

As shown in FIG. 13, when a power switch (not shown) of the MPU 16b is turned on, the main routine of the VSWR measuring process shown in FIG. 13 is started. First of all, it is judged at step S11 whether or not the start switch SW3 is turned on. Until the switch S3 is tuned on, the program flow becomes a stand-by state at step S11. When the switch SW3 is turned on (YES at step S11), the program flow goes to step S12. At step S12, the switch SW1 is switched over to the t1-side, and then, a VSWR measuring process shown in FIG. 14 of the carrier wave having the frequency f1 is executed at step S13. Thereafter, the switch SW1 is switched over to a t2-side at step S14, and a VSWR measuring process shown in FIG. 14 of the carrier wave having the frequency f2 is executed at step S15. Further, the switch SW1 is switched over to a t3-side at step S16, and a VSWR measuring process shown in FIG. 14 of the carrier wave having the frequency f3 is executed at step S17. Thereafter, the program flow goes back to step S11.

Figure 14:
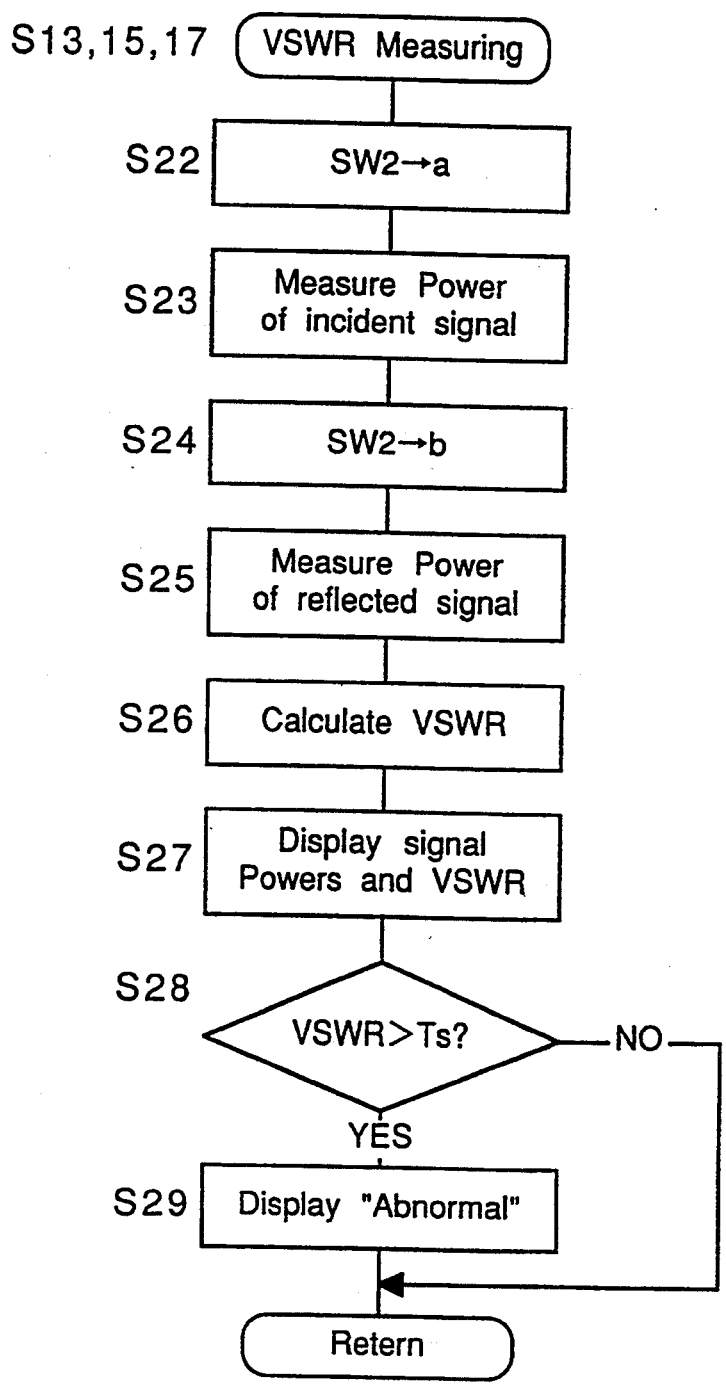
FIG. 14 is a flowchart showing a subroutine of a VSWR measuring process shown in FIG. 13.

FIG. 14 is a flowchart showing the VSWR measuring process (steps S13, S15 and S17) shown in FIG. 13.

Referring to FIG. 14, first of all, after the switch SW2 is switched over to the a-side at step S22, there is calculated an effective power of the progressive wave based on the level of the direct-current voltage signal inputted from the detector 34, at step S23. Thereafter, after the switch SW2 is switched over to the b-side at step S24, there is calculated an effective power of the reflected wave based on the level of the direct-current voltage signal inputted from the detector 34, at step S25. Further, after there is calculated a VSWR based on the calculated effective power of the progressive wave and the calculated effective power of the reflected wave at step S26, there is displayed the calculated effective powers of the respective waves and the calculated VSWR on the display unit 17 at step S27. Finally, the calculated VSWR is compared with a predetermined threshold value Ts such as Ts =1.3 at step S280 When the calculated VSWR is larger than the threshold value Ts (YES at step S28), antenna supervising information "Antenna system is in an abnormal state]" is displayed on the display unit 17, and then, the program flow goes back to the main routine. On the other hand, when the calculated VSWR is equal to or smaller than the above-mentioned threshold value Ts (NO at step S28), the program flow goes back to the main routine, directly.

In the present preferred embodiment, the effective power of the progressive wave, the effective power of the reflected wave and the VSWR are respectively converted into the respective values at the output terminal of the directional coupler 12b, and then, the converted values are displayed on the display unit 17.

Seventh preferred embodiment

Figure 12:
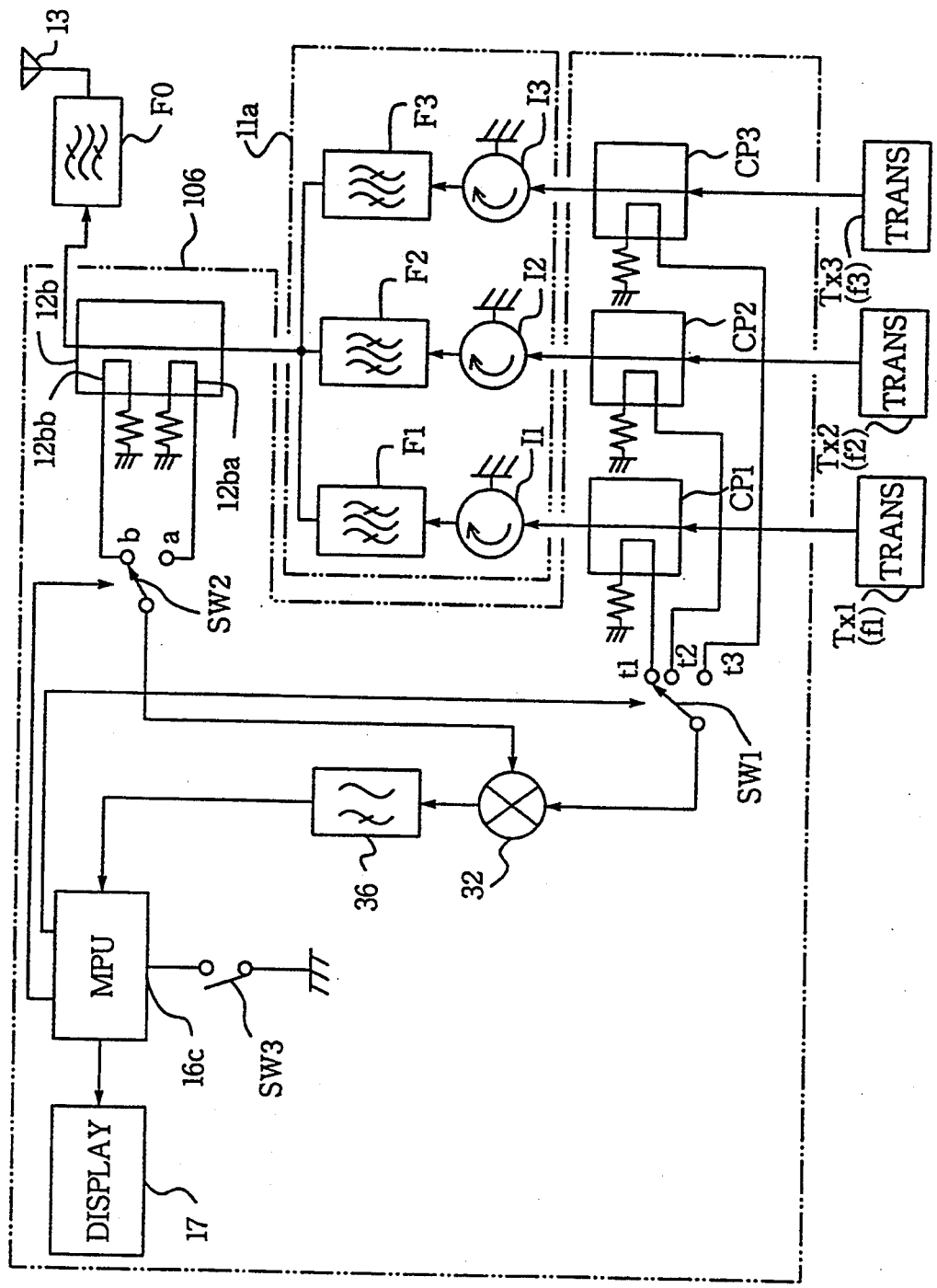
FIG. 12 is a schematic diagram showing an antenna supervising apparatus of a seventh preferred embodiment according to the present invention.

FIG. 12 shows an antenna supervising apparatus 106 of a seventh preferred embodiment according to the present invention. In FIG. 12, sections corresponding to those shown in FIGS. 4 and 6 are denoted by the same numerals as those shown in FIGS. 4 and 6, and the same description is omitted herein.

The features of the antenna supervising apparatus 106 of the present preferred embodiment which are differences between the present preferred embodiment and the fifth preferred embodiment shown in FIG. 6 are as follows.

(a) In stead of the directional coupler 12a, there is provided a directional coupler 12b comprising two coupling lines 12ba and 12bb for respectively detecting the progressive wave and the reflected wave of the multiplexed wave comprised of the above-mentioned carrier waves, and also is provided a switch SW2 controlled by an MPU 16c, for selectively outputting one of the progressive wave and the reflected wave respectively detected by the coupling lines 12ba and 12bb to the mixer 32. There is not provided the detector 35.

(b) In stead of the MPU 16a, there is provided the MPU 16c for controlling respective sections provided in the antenna supervising apparatus 106 and calculating a VSWR etc. on the transmission line. It is to be noted that a start switch SW3 for staring a process of the MPU 16c is connected to the MPU 16c.

(c) In order to simplify the description, an transmitter combiner 11a comprises three band-pass filters F1 to F3 and three isolators I1 to I3, and the antenna supervising apparatus 106 comprises three directional couplers CP1 to CP3. It is to be noted that the switch SW1 comprises three input terminals t1 to t3.

In the antenna supervising apparatus 106 constructed as described above, when the switch SW2 is switched over to the a-side after switching the switch SW1 to, for example, the t1-side, there can be obtained a direct-current voltage signal in proportion to the level of the progressive wave having the frequency f1 in the directional coupler 12b corresponding to the carrier wave having the frequency f1 selected by the switch SW1, by mixing the progressive wave transmitted from the transmitter Tx1 to the antenna system which is detected by the directional coupler CP1 with the progressive wave of the multiplexed wave comprised of the carrier waves having the frequencies f1 to f3 outputted from the transmitters Tx1 to Tx3 using the mixer 32 and passing the output of the mixer 32 through the low-pass filter 36, in a manner similar to that of the fifth preferred embodiment shown in FIG. 6.

Thereafter, when the switch SW2 is switched over to the b-side, there can be obtained a direct-current voltage signal in proportion to the level of the reflected wave having the frequency f1 in the directional coupler 12b corresponding to the carrier wave having the frequency f1 selected by the switch SW1, by mixing the progressive wave transmitted from the transmitter Tx1 to the antenna system which is detected by the directional coupler CP1 with the reflected wave of the multiplexed wave comprised of the carrier waves having the frequencies f1 to f3 outputted from the transmitters Tx1 to Tx3 using the mixer 32 and passing the output of the mixer 32 through the low-pass filter 36, similarly.

In the seventh preferred embodiment, since there is measured the respective levels of the progressive wave and the reflected wave of selected one frequency in the directional coupler 13, there can be measure a VSWR of the antenna system seen from the directional coupler 13 toward the antenna 13. Further, when an interference wave having a frequency different from that of a carrier wave to be measured is inputted from an external system to the antenna 13, the signal relating to the above interference wave which is outputted from the mixer 32 is eliminated by the low-pass filter 36. Therefore, the antenna supervising apparatus 106 of the present preferred embodiment can measure the VSWR corresponding to the carrier wave having each frequency without receiving any influence of an interference wave.

In the antenna supervising apparatus 106 of the present preferred embodiment, even though the carrier wave outputted from the transmitter Txi (i=1, 2, 3) is a modulation signal such as an FM signal, an MSK signal, a GMSK signal, the modulation component of the direct-current voltage signal is canceled by an action of the mixer 32 and the low-pass filter 36 so that only a main carrier wave component is outputted from the low-pass filter 36, and then, there is no change in the detected output due to the modulation. In this case, there is such an advantage that a precision of detecting the levels of the progressive wave and the reflected wave can be remarkably improved.

The MPU 16c of the present preferred embodiment executes the main routine shown in FIG. 13 in a manner similar to that of the MPU 16b of the sixth preferred embodiment, can measure the effective powers of the progressive waves and the reflected waves corresponding to the carrier waves having the respective frequencies and the VSWR, and has effects similar to those of the antenna supervising apparatus 105 of the sixth preferred embodiment.

Eighth preferred embodiment

Figure 15:
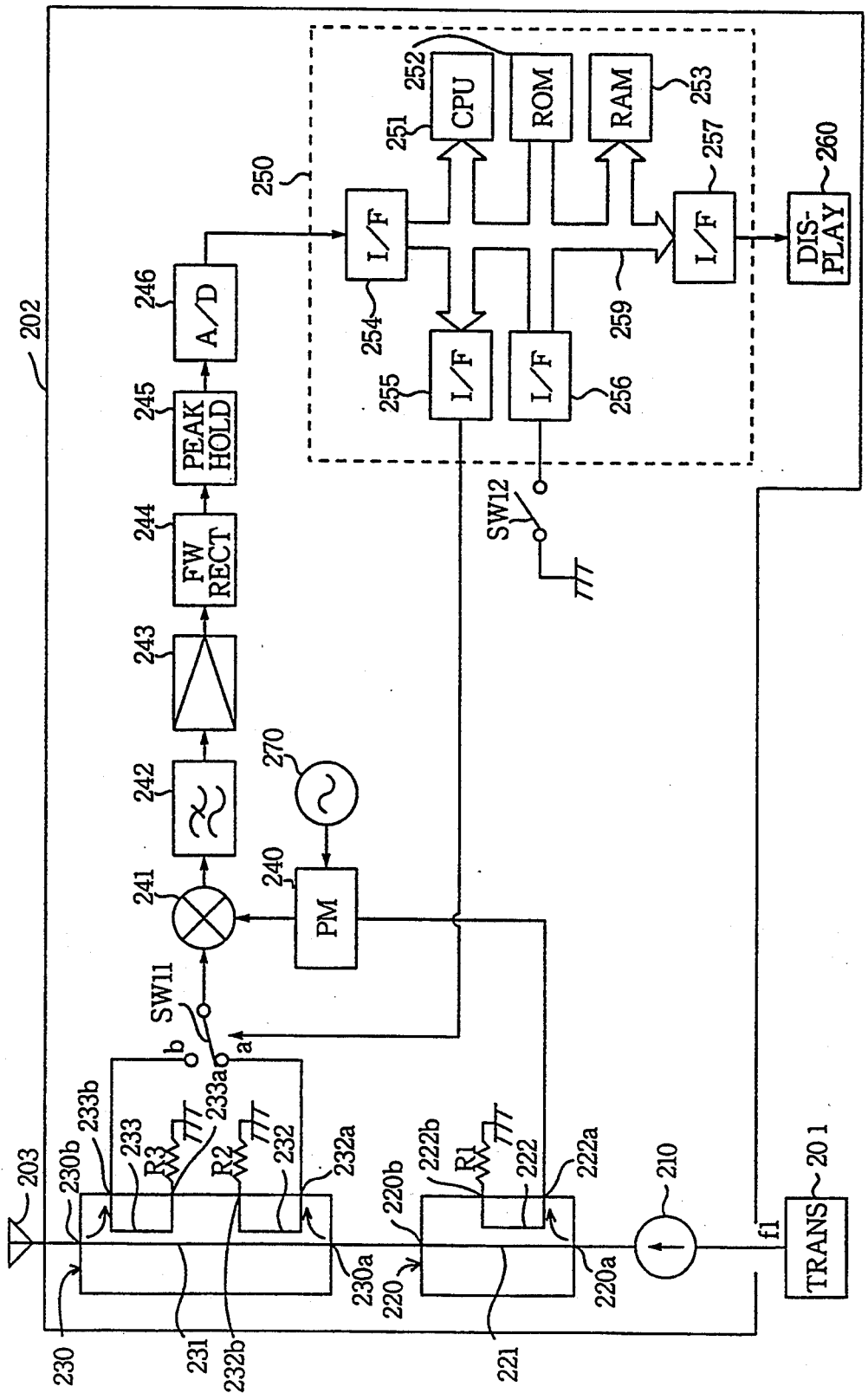
FIG. 15 is a schematic block diagram showing a VSWR measuring unit of an eighth preferred embodiment according to the present invention.

FIG. 15 shows a VSWR measuring unit 202 of an eighth preferred embodiment according to the present invention.

The features of the VSWR measuring unit 202 of the eighth preferred embodiment are as follows. A transmission signal outputted from a transmitter 201 is detected by a directional coupler 220 and is phase-modulated according to an audio frequency signal. On the other hand, a progressive signal of the transmission signal transmitted to an antenna 203 and a reflected signal thereof from the antenna 203 connected to an output terminal 230b of a directional coupler 230 are detected by the directional coupler 230 inserted between the directional coupler 220 and the antenna 203. Then, the progressive signal or the reflected signal which are detected by the directional coupler 230 is mixed with a phase-modulated progressive signal and is low-pass filtered. Thereafter, the filtered audio frequency signal is full-wave-rectified, and the peak of the rectified signal is held by a peak hold circuit 245. In response to the peak of the rectified signal, levels of the progressive signal and the reflected signal which are detected by the directional coupler 230 are calculated, and then, a VSWR on a transmission line located from the directional coupler 230 to the antenna 203 is calculated based on the respective levels of the calculated progressive signal and the reflected signal.

Referring to FIG. 15, a transmission signal of a frequency f1 having a predetermined level outputted from the transmitter 201 is outputted through an isolator 210, a pass line 221 of the directional coupler 220 for detecting a progressive signal and a pass line 231 of the directional coupler 230 for detecting a progressive signal and a reflected signal, to the antenna 203, so as to be projected toward a free space. The directional coupler 220 comprises the pass line 221 for passing through the transmission signal inputted from the transmitter 201, and a coupling line 222 for detecting a progressive signal, which is provided separately at a predetermined distance from the pass line 221 on a side of the input terminal 220a of the directional coupler 220 so as to be electromagnetically coupled with the pass line 221 and to detect a part of the power of the transmission signal passing through the pass line 221, the coupling line 222 detecting the transmission signal (referred to as a progressive signal hereinafter) passing through the pass line 221. A terminal 222b of the pass line 222 on a side of an output terminal 220b of the directional coupler 220 is terminated with a termination resistance R1. On the other hand, a terminal 222a of the pass line 222 on a side of an input terminal 220a of the directional coupler 220 is connected to an input terminal of a phase modulator 240.

In the direction coupler 220 constructed as described above, the transmission signal passing through the pass line 221 after being inputted from the isolator 210 to the input terminal 220a is inputted from the output terminal 220b to an input terminal 230a of the directional coupler 230, and also is detected by the coupling line 222 so that the detected progressive signal is outputted to the phase modulator 240. A signal generator 270 generates a sine-wave audio frequency signal of a frequency of, for example, 10 kHz having a predetermined level and outputs it to the phase modulator 240. The phase modulator 240 phase-modulates the progressive signal inputted from the directional coupler 220 according to the generated audio frequency signal, and outputs the modulated PM signal to a local oscillation signal input terminal of a mixer 241. The phase modulator 240 can be constituted by, for example, a three terminal type circulator, a transmission line connected to one terminal of which is connected to a varactor diode, or a 3 dB hybrid circuit, a pair of terminals of which is connected to varactor diodes. An operating point of each of the varactor diodes is biased by a negative direct-current bias voltage, and the generated audio frequency signal is inputted through a low-pass filter capable of passing through only the generated audio frequency signal to both ends of each of the varactor diodes, thereby phase-modulating the progressive signal of the frequency f1 passing through the other two terminals of the three terminal type circulator or another pair of terminals of the 3 dB hybrid circuit according to the generated audio frequency signal.

The directional coupler 230 comprises a pass line 231 for passing through the transmission signal inputted from the transmitter 201 through the directional coupler 220, a coupling line 232 for detecting a progressive signal provided separately at a predetermined distance from the pass line 231 on a side of the input terminal 230a of the directional coupler 230 so as to be electromagnetically coupled with the pass line 231 and to detect a part of the power of the transmission signal passing through the pass line 231, and a coupling line 233 for detecting a reflected signal provided separately at a predetermined distance from the pass line 231 on a side of the output terminal 230b of the directional coupler 230 so as to be electromagnetically coupled with the pass line 231 and to detect a part of the power of a reflected signal (referred to as a reflected signal hereinafter) coming back from the antenna 203 to the output terminal 230b, the coupling line 233 detecting the reflected signal. A terminal 232b of the coupling line 232 on a side of the output terminal 230b of the directional coupler 230 is terminated with a termination resistance R2, and a terminal 233a of the coupling line 233 on a side of the input terminal 230a of the directional coupler 230 is terminated with a termination resistance R3. A terminal 232a of the coupling line 232 on a side of the input terminal 230a of the directional coupler 230 is connected through an a-side of the switch SW11 to a main signal input terminal of the mixer 241, and a terminal 233b of the coupling line 233 on a side of the output terminal 230b of the directional coupler 230 is connected through a b-side of the switch SW11 to the main signal input terminal of the mixer 241.

In the directional coupler 230 constructed as described above, the progressive signal of the transmission signal passing through the pass line 231 after being inputted from the input terminal 230a from the directional coupler 220 is detected by the coupling line 232, and the detected progressive signal is inputted as a main signal through the a-side of the switch SW11 to the mixer 241. Further, the reflected signal of the transmission signal caused due to a miss-matching between an impedance seen from the output terminal 230b of the directional coupler 230 through a transmission line toward the antenna 203 and an output impedance of the directional coupler 230 is detected by the coupling line 233, and the detected reflected signal is inputted as a main signal through the b-side of the switch SW11 to the mixer 241.

The mixer 241 constituted by a multiplier mixes the signal inputted to the main signal input terminal thereof with the signal inputted to the local oscillation signal input terminal thereof, and outputs the mixed signals to a low-pass filter 242. The mixed signals outputted from the mixer 241 include a PM signal of a frequency 2f1 (=f1+f1), a PM signal of a direct-current voltage of a frequency (=f1−f1) namely the above-mentioned audio frequency signal outputted from the signal generator 270 etc. The low-pass filter 242 passes the above-mentioned audio frequency signal among the mixed signals therethrough, and outputs it through an audio frequency amplifier 243 for amplifying signals of frequencies from a direct-current to an audio frequency component, to a full-wave rectifier 244, for example, comprised of four rectifier diodes connected in a form of a bridge connection. The full-wave rectifier 244 full-wave rectifies the inputted audio frequency signal and outputs it to a peak hold circuit 245 constituted by an integrated circuit, for example, comprised of a capacitor and a resistance connected in parallel. The peak hold circuit 245 holds the peak of the inputted audio frequency signal, and outputs a signal for representing the peak thereof (referred to as a peak hold signal hereinafter) to an analogue to digital converter (referred to as an A/D converter hereinafter) 246. Thereafter, the A/D converter 246 converts the analogue peak hold signal into a digital signal and outputs the converted digital signal to a central processing unit (referred to as a CPU hereinafter) 251 through an interface 254 of an MPU 250.

Figure 18:
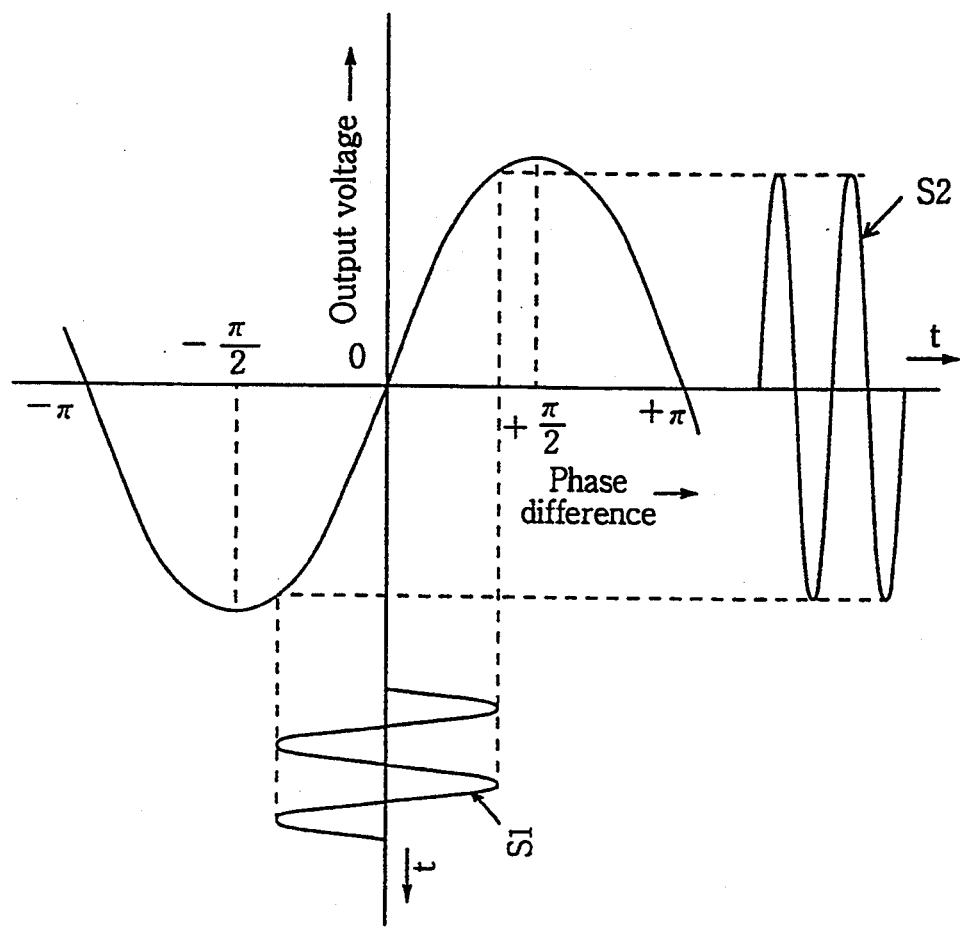
FIG. 18 is a graph showing a relationship between a phase difference between respective signals inputted to a mixer of the VSWR measuring unit shown in FIG. 15 and an output voltage of an audio frequency signal outputted from a low-pass filter thereof, an audio frequency signal outputted from a phase modulator and an audio frequency signal outputted from the low-pass filter.

FIG. 18 shows a relationship between a phase difference between the respective signals inputted to the mixer 241 and an output voltage of an audio frequency signal outputted from the low-pass filter 242 under a such condition that an output voltage of a phase detector comprised of the mixer 241 and the low-pass filter 242 is zero Volt when the phase difference between the respective signals inputted to the mixer 241 is zero radian.

As is apparent from FIG. 18, the output voltage of the phase detector comprised of the mixer 241 and the low-pass filter 242 changes depending on the phase difference between the respective signals inputted to the mixer 241. For example, when the progressive signal detected by the directional coupler 220 is phase-modulated according to a sine-wave audio frequency signal S1 outputted from the signal generator 270 so that the above-mentioned phase difference is within a phase range from $-\pi/2$ to $+\pi/2$, an audio frequency signal outputted from the phase detector becomes a sine-wave signal S2. The levels of the respective frequency components outputted from the mixer 241 comprised of a multiplier are in proportion to a product of the respective signals inputted to the mixer 241 and the level of the transmission signal inputted to the directional coupler 220 is a constant. Therefore, when the switch SW11 is switched over to the a-side, the level of the audio frequency signal S2 outputted from the low-pass filter 242 is in proportion to the level of the progressive signal detected by the directional coupler 230. On the other hand, when the switch SW11 is switched over to the b-side, the level of the audio frequency signal S2 outputted from the low-pass filter 242 is in proportion to the level of the reflected signal detected by the directional coupler 230.

Figure 19:
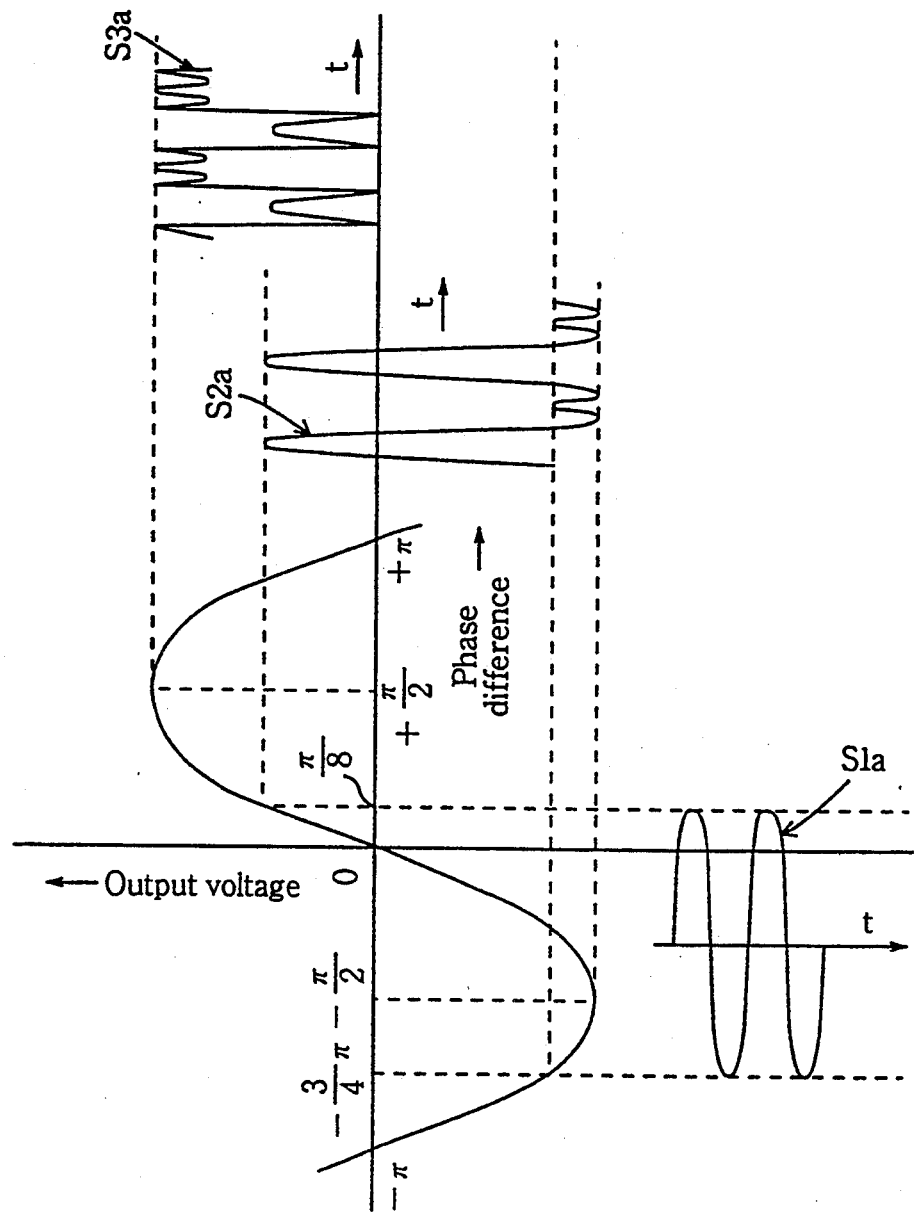
FIG. 19 is a graph showing a relationship between a phase difference between respective signals inputted to the mixer of the VSWR measuring unit shown in FIG. 15 and an output voltage of an audio frequency signal outputted from the low-pass filter thereof, an audio frequency signal outputted from the phase modulator, an audio frequency signal outputted from the low-pass filter, and an audio frequency signal outputted from a full-wave rectifier.

However, as shown in FIG. 19, when the phase difference between the respective signals inputted to the mixer 241 is shifted from a value of the state shown in FIG. 18 and the progressive signal detected by the directional coupler 220 is phase-modulated according to a sine-wave audio frequency signal S1a outputted from the signal generator 270 so that the above-mentioned phase difference is within a phase range from $-3\pi/4$ to $+\pi/8$, the audio frequency signal outputted from the above-mentioned phase detector becomes a signal S2a which is not a sine-wave signal. Therefore, in the present preferred embodiment, the audio frequency signal outputted from the low-pass filter 242 is amplified by the amplifier 243, is full-wave-rectified by the full-wave rectifier 244 so as to obtain a signal S3a of an absolute value of the audio frequency signal, and then, the peak of the signal S3a of the absolute value thereof is held by the peak hold circuit 245 so as to obtain the above-mentioned peak hold signal. When the switch SW11 is switched over to the a-side, the peak of the peak hold signal is in proportion to the level of the progressive signal detected by the directional coupler 230. On the other hand, when the switch SW11 is switched over to the b-side, the peak of the peak hold signal is in proportion to the level of the reflected signal detected by the directional coupler 230.

As described above, in the present preferred embodiment, since both of the PM modulator 240 and the above-mentioned phase detector are used and there is provided the full-wave rectifier 244 of an absolute value circuit and the peak hold circuit 245 on the following step of the above-mentioned phase detector, the levels of the progressive signal and the reflected signal can be correctly measured even though the phase difference between the respective signals inputted to the mixer 241 becomes any value. The VSWR measuring unit 202 of the present preferred embodiment can solve such a problem that the level of the reflected signal can not be measured in the antenna supervising apparatus 104 of the fifth preferred embodiment shown in FIG. 6 since the level of the direct-current signal of the reflected signal may be zero depending on the phase of the reflected signal, even though the reflected signal has a relative large level.

Further, there will be described below such a case that an interference signal having a frequency fit ($>$f1) other than the frequency f1 is inputted from an external apparatus to the antenna 203. In this case, the above-mentioned interference signal and the reflected signal having the frequency f1 are detected by the coupling line 233 of the directional coupler 230, and the detected signals are inputted through the b-side of the switch SW11 to the mixer 241. On the other hand, the PM signal of the progressive signal having the frequency f1 detected by the directional coupler 220 is inputted to the mixer 241. Therefore, the mixed signals outputted from the mixer 241 include a PM signal having a frequency 2f1 (=f1+f1), a PM signal of a direct-current voltage component (=f1−f1) namely the above-mentioned audio frequency signal outputted from the signal generator 270, a PM signal having a frequency (fit+f1), and a PM signal having a frequency (fit−f1) etc.. However, the low-pass filter 242 passes only the above-mentioned audio frequency signal among the inputted mixed signals therethrough. Therefore, since the PM signal relating to the interference signal is prevented from passing through the low-pass filter 242 by the low-pass filter 242, the VSWR measuring unit 202 of the present preferred embodiment can measure the VSWR with respect to the transmission signal on the transmission located from the directional coupler 230 to the antenna 203, correctly, without receiving any influence of the interference signal even though the interference signal having a relatively large level is inputted from an external apparatus to the antenna 203.

An MPU 250 of the VSWR measuring unit 202 comprises the CPU 251 for executing a VSWR measuring process, a read only memory (referred to as a ROM hereinafter) 252 for storing a control program of the above-mentioned VSWR measuring process and data required for executing the above-mentioned control program, and a random access memory (referred to as a RAM hereinafter) 253 used as a working area for storing data inputted through interfaces 254 and 256. The MPU 250 further comprises the interfaces 254 to 257, and the CPU 251, the ROM 252, the RAM 253 and the interfaces 254 to 257 are connected through a bus 259. Further, the interface 255 is connected to a control terminal of the switch SW11, the interface 256 is connected through a start switch SW12 to the ground, and the interface 257 is connected to a display unit 260.

When the CPU 251 executes the above-mentioned VSWR measuring process, the CPU 251 controls the switch SW11 through the interface 255 so as to selectively switch over to the a-side or the b-side, and also outputs data of calculated results of the VSWR measuring process to the display unit 260 so as to display it thereon.

Figure 20:
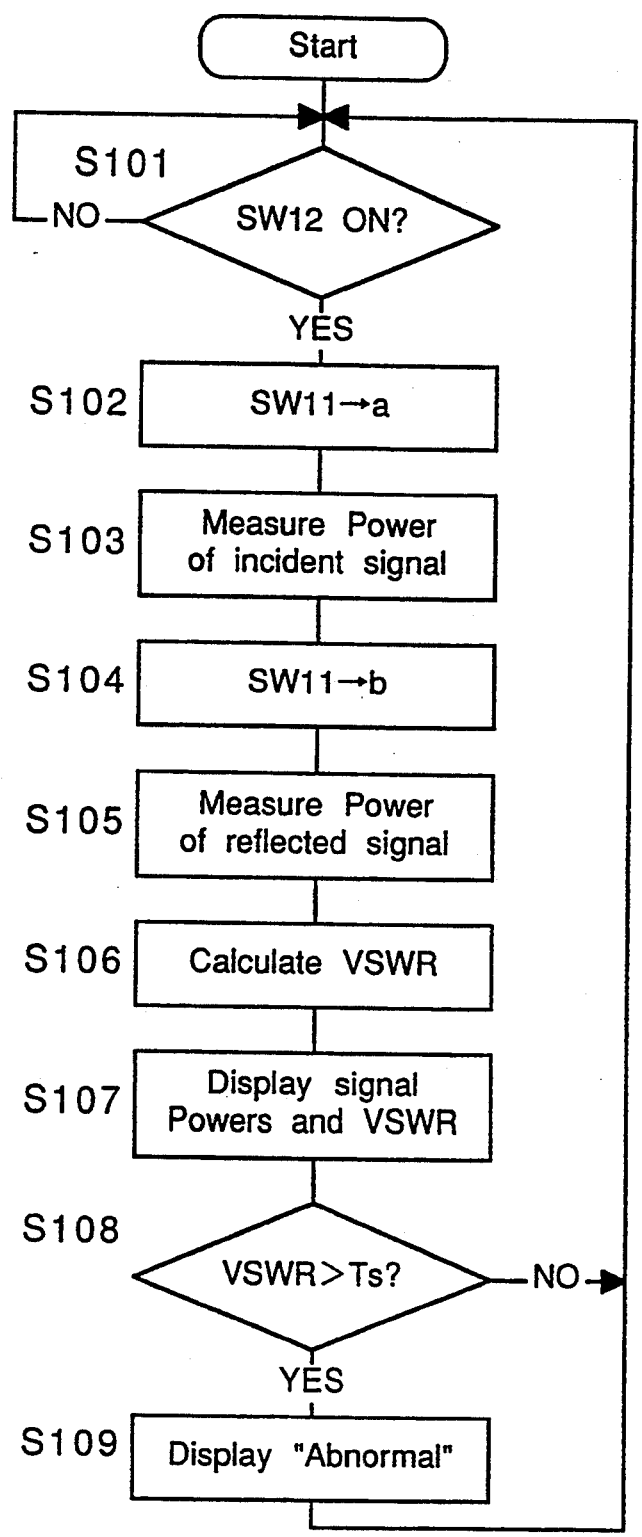
FIG. 20 is a flowchart showing a main routine executed by a micro processing unit of the VSWR measuring unit shown in FIG. 15.

FIG. 20 is a flowchart showing a main routine of the VSWR measuring process executed by the MPU 250 of the VSWR measuring unit 202 of the present preferred embodiment, and the main routine includes a process for measuring the level of the progressive signal of the transmission signal transmitted from the transmitter 201 through the directional couplers 220 and 230 of the VSWR measuring unit 202 to the antenna 203 and the level of the reflected signal from the antenna 203, and thereafter, for calculating a VSWR based on the measured levels.

As shown in FIG. 20, when a power switch (not shown) of the MPU 250 is turned on, the main routine of the VSWR measuring process shown in FIG. 20 is started, and then, first of all, it is judged at step S101 whether or not the start switch SW12 is turned on. Until the switch SW12 is turned on, the program flow becomes a stand-by state. When the switch SW12 is turned on (YES at step S101), the program flow goes to step S102. After the switch SW11 is switched over to the a-side at step S102, there is calculated an effective power of the progressive signal based on the level of the peak hold signal inputted from the A/D converter 246 through the interface 254 at step S103. Thereafter, the switch SW11 is switched over to the b-side at step S104, and then, there is calculated an effective power of the reflected signal based on the level of the peak hold signal inputted from the A/D converter 246 through the interface 254 at step S105. Further, there is calculated a VSWR based on the calculated effective powers of the progressive signal and the reflected signal at step S106, and then, there is displayed the calculated effective powers of the respective signals and the calculated VSWR on the display unit 260 at step S107. Finally, it is judged at step S108 whether or not the calculated VSWR is larger than a predetermined threshold value Ts such as Ts=1.3. When the calculated VSWR is larger than the threshold value Ts (YES at step S108), display information "The antenna system is in an abnormal state!" is displayed on the display unit 260 at step S109, and then, the program flow goes back to step S101. On the other hand, the calculated VSWR is equal to or smaller than the threshold value Ts (NO at step S108), the program flow goes back to step S101, directly.

In the present preferred embodiment, all of the effective powers of the progressive signal and the reflected signal and the VSWR are converted into respective values on the output terminal 230b of the directional coupler 230 in a manner similar to that known to those skilled in the art, and the converted values are displayed on the display unit 260.

In the present preferred embodiment, there is used the directional coupler 220, however, the present invention is limited to this. There is not provided the directional coupler 220, and the progressive signal outputted from the output terminal 232a of the directional coupler 230 may be inputted to the PM modulator 240. Further, the level of the progressive signal may be measured by detecting the progressive signal detected by the directional coupler 220 or 230 using a detector comprised of a diode and converting the detected progressive signal into a digital signal using an A/D converter so as to output the converted digital signal to the MPU 250.

Ninth preferred embodiment

Figure 16:
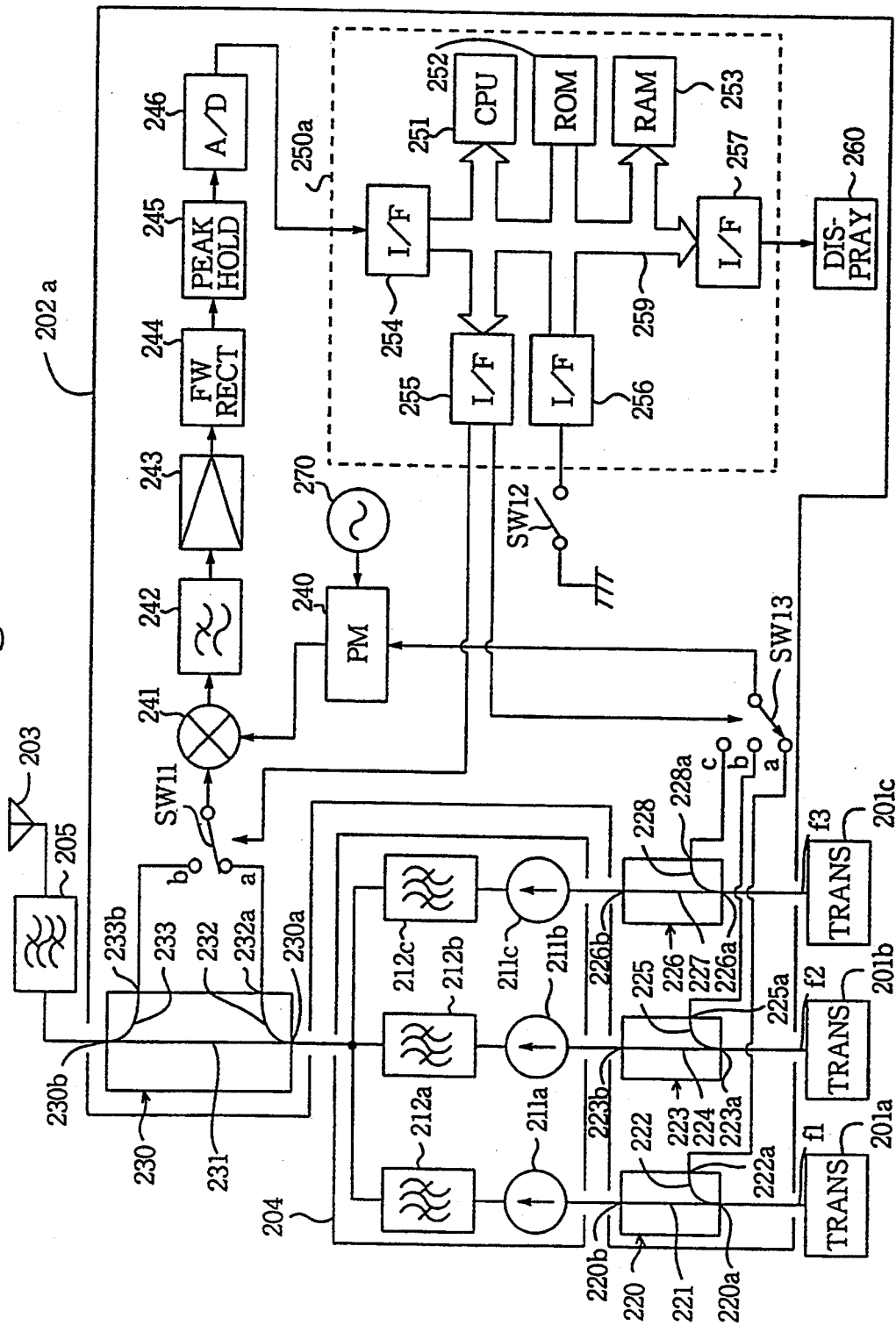
FIG. 16 is a schematic block diagram showing a VSWR measuring unit and a transmitter combiner of a ninth preferred embodiment according to the present invention.

FIG. 16 shows a VSWR measuring unit 202a and a transmitter combiner 204 of a ninth preferred embodiment according to the present invention. In FIG. 16, the same sections as those shown in FIG. 15 are denoted by the same numerals as those shown in FIG. 15. Further, symbols of the directional couplers 220, 223, 226 and 230 are simplified, and the termination resistances connected to the directional couplers 220, 223, 226 and 230 are omitted in FIG. 16.

The VSWR measuring unit 202a of the ninth preferred embodiment is characterized in that, three channel type transmitter combiner 204 is connected thereto, and VSWRs with respect to respective transmission signals outputted from respective transmitters 201a, 201b and 201c are measured using the measuring principle of the VSWR described in the eighth preferred embodiment. The differences between the present preferred embodiment and the eighth preferred embodiment will be mainly described below.

The respective transmission signals of UHF band frequencies f1, f2 and f3 (f1>f2>f3) different from each other having predetermined levels respectively outputted from the transmitters 201a, 201b and 201c are inputted through respective pass lines 221, 224 and 227 of the directional couplers 220, 223 and 226 provided within the VSWR measuring unit 202a to the transmitter combiner 204. The respective directional couplers 220, 223 and 226 have structures similar to that of the directional coupler 220 of the eighth preferred embodiment. Namely, the directional coupler 223 comprises the pass line 224 and a coupling line 225 for detecting a progressive signal, wherein the pass line 224 has an input terminal 223a and an output terminal 223b on both ends thereof, and the coupling line 222 has an output terminal 225a. Further, the directional coupler 226 comprises the pass line 227 and a coupling line 228 for detecting a progressive signal, wherein the pass line 227 has an input terminal 226a and an output terminal 226b on both ends thereof, and the coupling line 228 has an output terminal 228a. The progressive signals outputted from the respective output terminals 222a, 225a and 228a of the coupling lines 222, 225 and 228 of the directional couplers 220, 223 and 226 are respectively outputted through an a-side, a b-side and a c-side of the switch SW13 selectively switched by the CPU 251 of an MPU 250a to the phase modulator 240. A control terminal of the switch SW13 is connected to the interface 255 provided in the MPU 250a.

The transmitter combiner 204 is a frequency multiplexer for frequency-multiplexing the respective transmission signals of frequencies f1, f2 and f3 to output a multiplexed signal, and comprises an isolator 211a for passing the transmission signal of the frequency f1 therethrough in a direction from the transmitter 201a to the antenna 203, a band-pass filter 212a for passing only a frequency band component of the transmission signal of the frequency f1 therethrough, an isolator 211b for passing the transmission signal of the frequency f2 therethrough in a direction from the transmitter 201b to the antenna 203, a band-pass filter 212b for passing only a frequency band component of the transmission signal of the frequency f2 therethrough, an isolator 211c for passing the transmission signal of the frequency f3 therethrough in a direction from the transmitter 201c to the antenna 203, and a band-pass filter 212c for passing only a frequency band component of the transmission signal of the frequency f3 therethrough. Output terminals of the respective band-pass filters 212a, 212b and 212c are electrically connected to each other and are further electrically connected to the input terminal 230a of the directional coupler 230. The transmission signal outputted from the directional coupler 220 is inputted through the isolator 211a and the band-pass filter 212a to the directional coupler 230, the transmission signal outputted from the directional coupler 223 is inputted through the isolator 211b and the band-pass filter 212b to the directional coupler 230, and the transmission signal outputted from the directional coupler 226 is inputted through the isolator 211c and the band-pass filter 212c to the directional coupler 230.

The multiplexed signal comprised of the respective transmission signals of the frequencies f1, f2 and f3 outputted from the transmitter combiner 204 is outputted through the pass line 231 of the directional coupler 230 and a transmission band-pass filter 205 for passing only frequency band components including the above-mentioned frequencies f1, f2 and f3 therethrough to the antenna 203 so as to be projected from the antenna 203 toward a free space. In the directional coupler 230, the progressive signal of the multiplexed signal is detected by the coupling line 232, and the detected progressive signal thereof is outputted from the output terminal 232a through the a-side of the switch SW11 to the mixer 241. Further, the reflected signal of the multiplexed signal caused due to a miss-matching between an impedance seen from the output terminal 230b of the directional coupler 230 toward the antenna 203 and an output impedance of the pass line 231 is detected by the coupling line 233, and then, the detected reflected signal thereof is outputted from the output terminal 233b through the b-side of the switch SW11 to the mixer 241.

In the VSWR measuring unit 202a constructed as described above, for example, when the switch SW13 is switched over to the a-side and the switch SW11 is switched over to the a-side, the progressive signal of the multiplexed signal is inputted to the mixer 241, and also the PM signal of the progressive signal of the transmission signal of the frequency f1 detected by the directional coupler 220 is inputted to the mixer 241. Therefore, the mixed signals outputted from the mixer 241 include a PM signal of a frequency 2f1 (=f1+f1), a PM signal of a direct-current voltage component (=f1−f1) namely the above-mentioned audio frequency signal outputted from the signal generator 270, a PM signal of a frequency (f1+f2), a PM signal of a frequency (f1−f2), a PM signal of a frequency (f1+f3), a PM signal of a frequency (f1−f3) etc. The low-pass filter 242 passes only the above-mentioned audio frequency signal in proportion to the level of the progressive signal of the frequency f1 among the mixed signals therethrough. Therefore, there can be correctly measured the level of the progressive signal of the transmission signal of the frequency f1 without receiving any influence of the progressive signals of the frequencies f2 and f3 other than the progressive signal of the frequency f1 selected by the switch SW13. Further, when the switch SW11 is switched over to the b-side, there can be correctly measured the level of the reflected signal of the transmission signal of the frequency f1 without receiving any influence of the reflected signals of the frequencies f2 and f3 other than the progressive signal of the frequency f1 selected by the switch SW13, similarly. Furthermore, the levels of the progressive signal and the reflected signal of the other frequencies f2 and f3 can be correctly measured by sequentially switching over the switch SW13 to the b-side or the c-side, similarly.

Furthermore, even though an interference signal having a relatively large level is inputted from an external apparatus to the antenna 203, the VSWR measuring unit 202a of the present preferred embodiment can correctly measure the VSWRs with respect to the respective transmission signals without receiving any influence of an interference signal, in a manner similar to that of the eighth preferred embodiment.

The MPU 250a of the present preferred embodiment executes a VSWR measuring process which will be described below.

Figure 21:
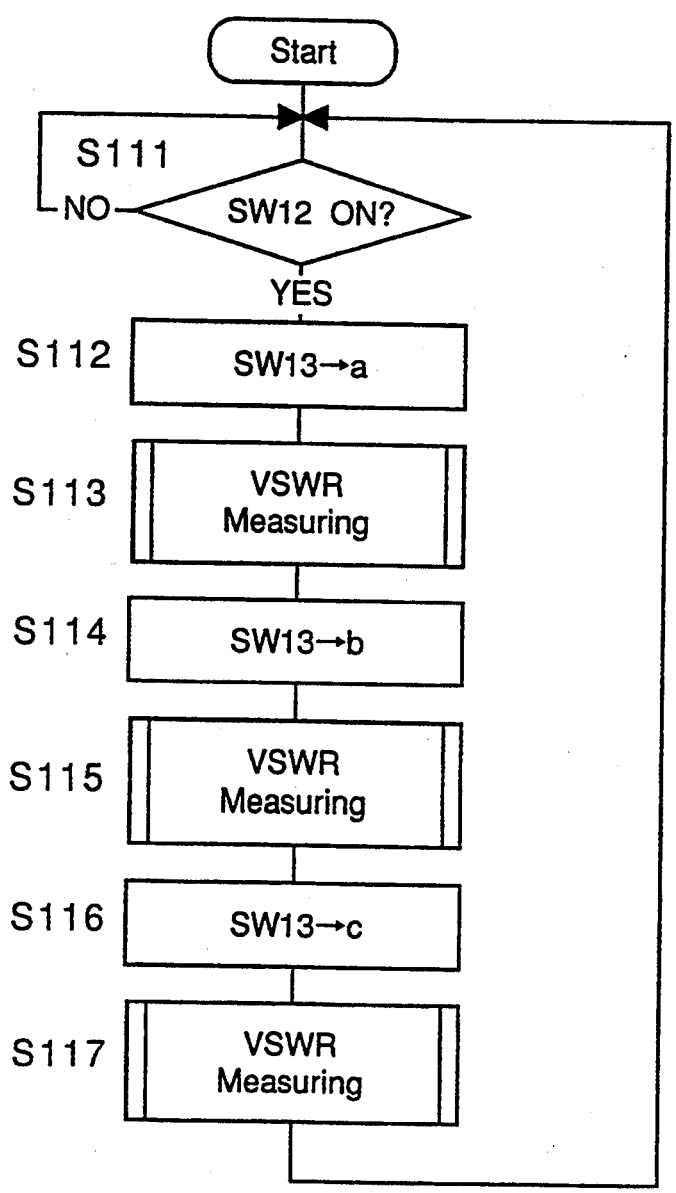
FIG. 21 is a flowchart showing a main routine executed by a micro processing unit of the VSWR measuring unit shown in FIG. 16.

FIG. 21 is a flowchart showing a main routine of the VSWR measuring process of the MPU 250a of the VSWR measuring unit 202a of the ninth preferred embodiment, and the main routine is a process for measuring the levels of the progressive signals of the respective transmission signal outputted from the respective transmitters 201a, 201b and 201c through the respective directional couplers 220, 223 and 226 of the VSWR measuring unit 202a, the transmitter combiner 204, the directional coupler 230 of the unit 202a and the transmission band-pass filter 205 to the antenna 203, and the levels of the reflected signals of the respective transmission signals from the antenna. 203, and thereafter, for calculating the VSWRs with respect to the respective transmission signals based on the calculated levels of the progressive signals and the reflected signals thereof.

As shown in FIG. 21, when a power switch (not shown) of the MPU 250a is turned on, the main routine of the VSWR measuring process shown in FIG. 21 is started, and first of all, it is Judged at step S111 whether or not the start switch SW12 is turned on. Until the start switch SW12 is turned on, the program flow becomes a stand-by state at step S111. Thereafter, when the start switch SW12 is turned on (YES at step S111), the program flow goes to step S112. After the switch SW13 is switched over to the a-side at step S112, a subroutine of a VSWR measuring process shown in FIG. 22 with respect to the transmission signal of the frequency f1 is executed at step S113. Thereafter, after the switch SW13 is switched over to the b-side at step S114, the subroutine of the VSWR measuring process shown in FIG. 22 with respect to the transmission signal of the frequency f2 is executed at step S115. Further, after the switch SW13 is switched over to the c-side at step S116, the subroutine of the VSWR measuring process shown in FIG. 22 with respect to the transmission signal of the frequency f3 is executed at step S117, and then, the program flow goes back to step S111.

Figure 22:
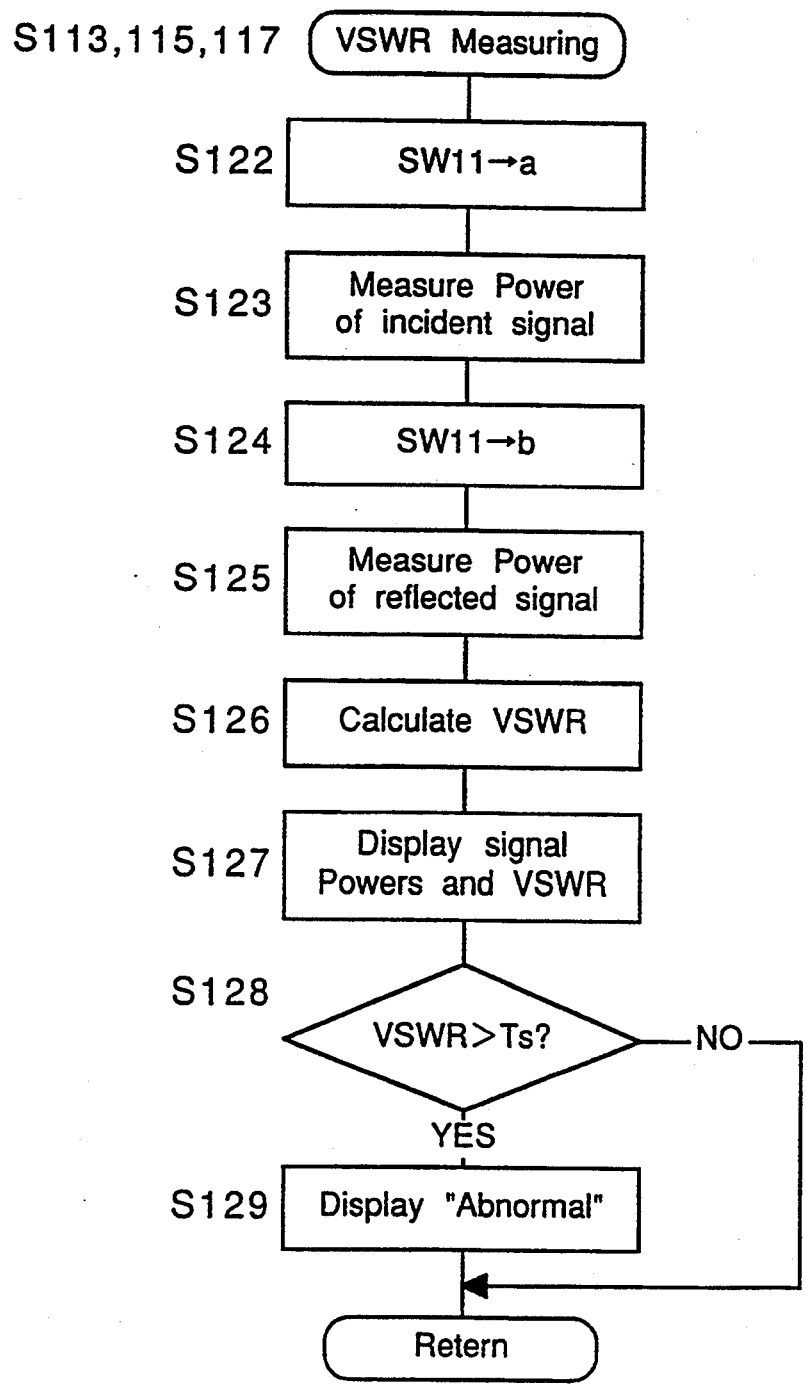
FIG. 22 is a flow chart showing a subroutine of a VSWR measuring process shown in FIG. 21.

FIG. 22 is a flowchart showing the subroutine of the VSWR measuring process (steps S113, S115 and S117). Processes of steps S122 to S129 are executed in a manner similar to that of the respective processes of steps S102 to S109 shown in FIG. 20.

Tenth preferred embodiment

Figure 17:
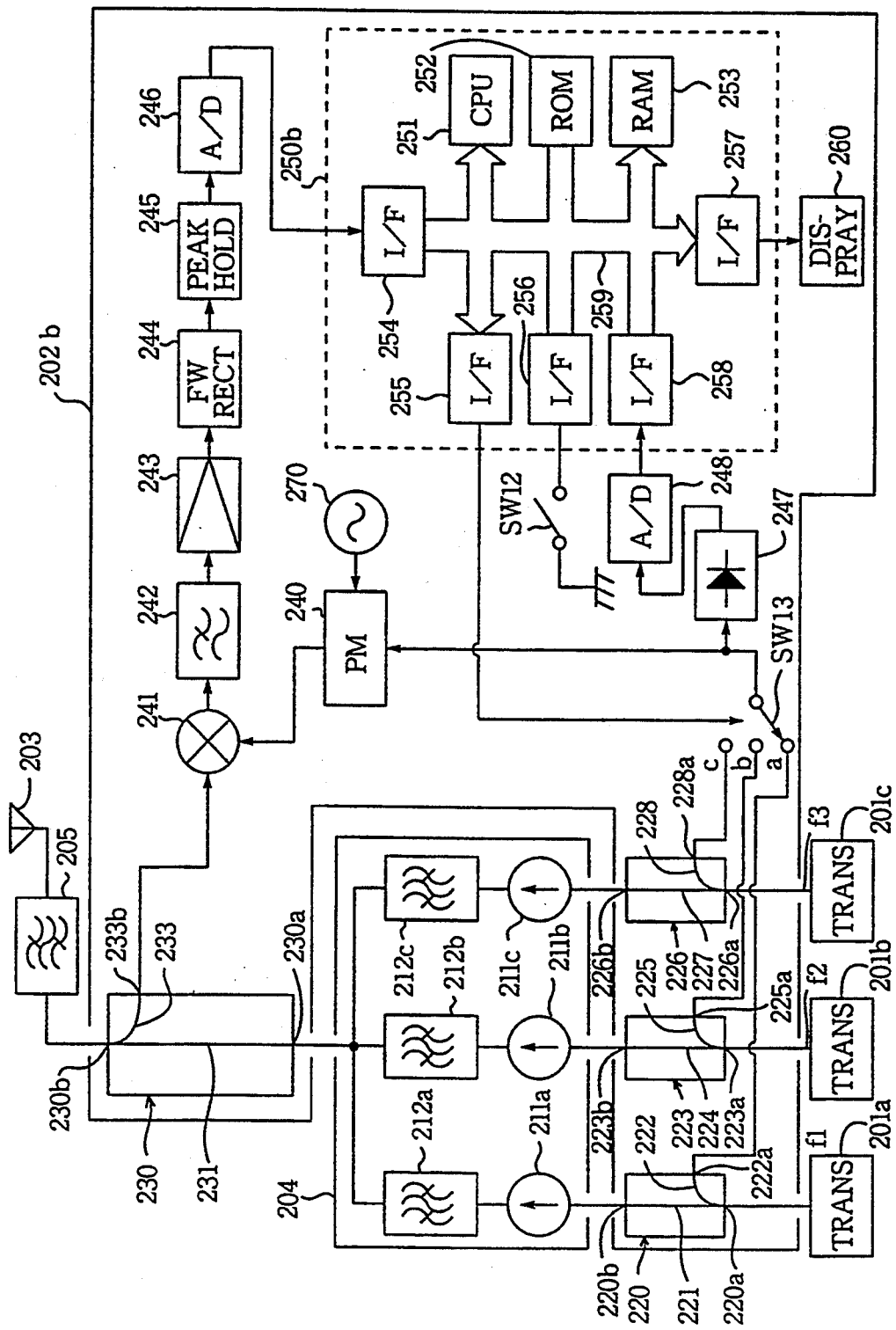
FIG. 17 is a schematic block diagram showing a VSWR measuring unit and a transmitter combiner of a tenth preferred embodiment according to the present invention.

FIG. 17 shows a VSWR measuring unit 202b and the transmitter combiner 204 of a tenth preferred embodiment according to the present invention. In FIG. 17, the same sections as those shown in FIG. 16 are denoted by the same numerals as those shown in FIG. 16.

The VSWR measuring apparatus 202b of the tenth preferred embodiment is characterized in that, the progressive signals of the respective transmission signals are not detected by the directional coupler 230 of the ninth preferred embodiment, and there is measured the levels of the progressive signals of the respective transmission signals based on those detected by the respective directional couplers 220, 223 and 226. The differences between the present preferred embodiment and the ninth preferred embodiment will be described below.

Referring to FIG. 17, as is apparent from comparison between the present preferred embodiment and the ninth preferred embodiment shown in FIG. 16, it is unnecessary to provide the coupling line 232 for detecting the progressive signal within the directional coupler 230, and the switch SW11, the progressive signal outputted from the common terminal of the switch SW13 is detected by a detector 247 of a diode, and the detected progressive signal is inputted through an A/D converter 248 and an interface 258 connected to the bus 259 provided in an MPU 250b. The MPU 250b further comprises the interface 258 in addition to the circuits of the MPU 250a of the ninth preferred embodiment, and the MPU 250b executes the main routine shown in FIG. 21 and the subroutine shown in FIG. 22, similarly, except for a process of step S123 for calculating the level of the progressive signals of the respective transmission signals based on the signal inputted from the detector 247 through the A/D converter 248 and the interface 258 to the CPU 251.

The VSWR measuring unit 202b of the present preferred embodiment has the above-mentioned advantages similar to those of the VSWR measuring unit 202 of the ninth preferred embodiment.

Other preferred embodiments

At step 28 of FIG. 14 of the sixth preferred embodiment, step S108 of FIG. 20 of the tenth preferred embodiment and step S128 of FIG. 22 of the ninth preferred embodiment, an abnormal state of the antenna system is detected by judging the calculated VSWR, the present invention is not limited to this. An abnormal state of the antenna system may be detected by Judging the measured level of the reflected wave.

In the eighth to tenth preferred embodiments, there is used the phase modulator 40, however, the present invention is not limited to this. There may be used an angle modulator such as a frequency modulator.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention .as defined by the appended claims unless they depart therefrom.

What is claimed is:

1. A standing wave ratio measuring apparatus comprising a transmission line, one end of which is connected to a load, said apparatus measuring a standing wave ratio with respect to a high frequency signal transmitted on said transmission line based on a level of an incident signal passing through said transmission line and a level of a reflected signal coming back from said load to said transmission line when said high frequency signal having a predetermined level is inputted to another end of said transmission line, said apparatus comprising:

first coupling means provided on said transmission line for detecting said incident signal; p1 second coupling means provided on said transmission line for detecting said reflected signal;

modulating means for angle-modulating said incident signal detected by said first coupling means according to a signal having a predetermined level and outputting a modulation signal;

mixing means for mixing said reflected signal detected by said second coupling means with said modulation signal outputted from said modulating means and outputting said mixed signals;

low-pass filtering means for filtering a signal from said mixed signals outputted from said mixing means;

rectifying means for rectifying said signal filtered by said low-pass filtering means and outputting a first signal for representing an absolute value of said filtered signal;

integrating means for integrating said first signal outputted from said rectifying means and outputting a second signal for representing a peak value of said first signal;

first calculating means for calculating a level of said incident signal based on said incident signal detected by said first coupling means;

second calculating means for calculating a level of said reflected signal based on said second signal outputted from said integrating means; and third calculating means for calculating a standing wave ratio on said transmission line based on the level of said incident signal calculated by said first calculating means and the level of said reflected signal calculated by said second calculating means.

2. A standing wave ratio measuring apparatus comprising a transmission line, one end of which is connected to a load, said apparatus measuring a standing wave ratio with respect to a high frequency signal transmitted on said transmission line based on a level of an incident signal passing through said transmission line and a level of a reflected signal coming back from said load to said transmission line when said high frequency signal having a predetermined level is inputted to another end of said transmission line, said apparatus comprising:

first coupling means provided on said transmission line for detecting said incident signal;

second coupling means provided on said transmission line for detecting said reflected signal;

modulating means for angle-modulating said incident signal detected by said first coupling means according to a signal having a predetermined level and outputting a modulation signal;

mixing means for respectively mixing said reflected signal detected by said second coupling means and said incident signal detected by said first coupling means with said modulation signal outputted from said modulating means and outputting said respective mixed signals;

low-pass filtering means for respectively filtering respective signals from said respective mixed signals outputted from said mixing means;

rectifying means for respectively rectifying said respective signals filtered by said low-pass filtering means and outputting respective first signals for representing absolute values of said filtered respective signals;

integrating means for respective integrating said respective first signals outputted from said rectifying means and outputting respective second signals for representing peak values of said respective first signals;

first calculating means for respectively calculating a level of said incident signal and a level of said reflected signal based on said respective second signals outputted from said integrating means; and second calculating means for calculating a standing wave ratio on said transmission line based on the level of said incident signal and the level of said reflected signal calculated by said first calculating means.

3. A reflected signal measuring apparatus comprising a transmission line, one end of which is connected to a load, said apparatus measuring a level of a reflected signal coming back from said load to said transmission line when said high frequency signal having a predetermined level is inputted to another end of said transmission line, said apparatus comprising:

first coupling means provided on said transmission line for detecting an incident signal passing through said transmission line when said high frequency signal is inputted to another end of said transmission line;

second coupling means provided on said transmission line for detecting said reflected signal;

modulating means for angle-modulating said incident signal detected by said first coupling means according to a signal having a predetermined level and outputting a modulation signal;

mixing means for mixing said reflected signal detected by said second coupling means with said modulation signal outputted from said modulating means and outputting said mixed signals;

low-pass filtering means for filtering a signal from said mixed signals outputted from said mixing means;

rectifying means for rectifying said signal filtered by said low-pass filtering means and outputting a first signal for representing an absolute value of said filtered signal;

integrating means for integrating said first signal outputted from said rectifying means and outputting a second signal for representing a peak value of said first signal; and calculating means for calculating a level of said reflected signal based on said second signal outputted from said integrating means.

4. A standing wave ratio measuring apparatus used for a transmission system for frequency-multiplexing a plurality of high frequency signals having frequencies different from each other using frequency multiplexing means and supplying a multiplexed signal comprised of said plurality of high frequency signals through a transmission line to a load, said apparatus measuring standing wave ratios on said transmission line with respect to said plurality of high frequency signals, said apparatus comprising:

first coupling means provided on said transmission line for detecting an incident signal;

second coupling means provided on said transmission line for detecting said reflected signal;

third coupling means for detecting said respective high frequency signals;

switching for selecting one of said respective high frequency signals detected by said third coupling means and outputting said selected high frequency signal;

modulating means for angle-modulating said selected high frequency signal outputted from said switching means according to a signal having a predetermined level and outputting a modulation signal;

mixing means for respectively mixing said incident signal by said first coupling means and said reflected signal detected by said second coupling means with said modulation signal outputted from said modulating means and outputting said respective mixed signals;

low-pass filtering means for respectively filtering respective signals from said respective mixed signals outputted from said mixing means;

rectifying means for respectively rectifying said respective signals filtered by said low-pass filtering means and outputting respective first signals for representing absolute values of said filtered respective signals;

integrating means for respectively integrating said respective first signals outputted from said rectifying means and outputting respective second signals for representing peak values of said respective first signals;

first calculating means for respectively calculating a level of said incident signal and a level of said reflected signal based on said respective second signals outputted from said integrating means; and second calculating means for respectively calculating standing wave ratios on said transmission line with respect to said high frequency signals based on the level of said incident signal and the level of said reflected signal calculated by said first calculating means by controlling said switching means to sequentially select said respective high frequency signals.

5. A reflected signal measuring apparatus used for a transmission system for frequency-multiplexing a plurality of high frequency signals having frequencies different from each other using frequency multiplexing means and supplying a multiplexed signal comprised of said plurality of high frequency signals through a transmission line to a load, said apparatus measuring levels of a reflected signals with respect to said high frequency signals coming back from said load to said transmission line, said apparatus comprising:

first coupling means provided on said transmission line for detecting said reflected signal;

second coupling means provided on a previous step of said frequency multiplexing means for detecting said respective high frequency signals;

switching for selecting one of said respective high frequency signals detected by said second coupling means and outputting said selected high frequency signal;

modulating means for angle-modulating said selected high frequency signal outputted from said switching means according to a signal having a predetermined level and outputting a modulation signal;

mixing means for mixing said reflected signal by said first coupling means with said modulation signal outputted from said modulating means and outputting said mixed signal;

low-pass filtering means for filtering a signal from said mixed signal outputted from said mixing means;

rectifying means for rectifying said signal filtered by said low-pass filtering means and outputting a first signal for representing an absolute value of said filtered signal;

integrating means for integrating said first signal outputted from said rectifying means and outputting a second signal for representing a peak value of said first signal; and calculating means for respectively calculating levels of said reflected signals on said transmission line with respect to said high frequency signals based on said second signal outputted from said integrating means by controlling said switching means to sequentially select said respective high frequency signals.

6. The apparatus as claimed in claim 1, wherein said modulating means is a phase modulator.

7. The apparatus as claimed in claim 2, wherein said modulating means is a phase modulator.

8. The apparatus as claimed in claim 3, wherein said modulating means is a phase modulator.

9. The apparatus as claimed in claim 4, wherein said modulating means is a phase modulator.

10. The apparatus as claimed in claim 5, wherein said modulating means is a phase modulator.

11. The apparatus claimed in claim 4, wherein said first coupling means and said second coupling means each comprise a directional coupler.

* * * * *